(12) United States Patent
Ohkawa

(10) Patent No.: US 6,930,299 B2
(45) Date of Patent: Aug. 16, 2005

(54) SEMICONDUCTOR DEVICE FOR READING SIGNAL FROM PHOTODIODE VIA TRANSISTORS

(75) Inventor: Narumi Ohkawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 133 days.

(21) Appl. No.: 10/648,731

(22) Filed: Aug. 27, 2003

(65) Prior Publication Data

US 2004/0169127 A1 Sep. 2, 2004

(30) Foreign Application Priority Data

Aug. 29, 2002 (JP) .......................... 2002-251265

(51) Int. Cl.$^7$ .................... H01L 27/00; H04N 3/14
(52) U.S. Cl. .................. 250/208.1; 250/214.1; 348/308; 257/448
(58) Field of Search ................... 250/208.1, 214.1; 348/294, 302, 308, 303, 304; 257/290–292, 431, 443, 444, 448

(56) References Cited

U.S. PATENT DOCUMENTS 6,352,869 B1 * 3/2002 Guidash ...................... 438/16
6,587,146 B1 * 7/2003 Guidash ...................... 348/308

FOREIGN PATENT DOCUMENTS

| JP | 2001-298176 | 10/2001 |
|----|-------------|---------|
| JP | 2002-83949  | 3/2002  |

* cited by examiner

Primary Examiner—Kevin Pyo
(74) Attorney, Agent, or Firm—Westerman, Hattori, Daniels & Adrian, LLP

(57) ABSTRACT

Pixels are disposed on a semiconductor substrate in a matrix shape. Each pixel includes a photodiode, a reset transistor, a source follower transistor and a select transistor. An active region in which the photodiode and transistors are disposed includes a first area in which the photodiode is disposed and a second area having an are elongated in a first direction. Each of the gate electrodes of the reset transistor, source follower transistor and select transistor crosses the area, elongated in the first direction, of the second area. An intra-pixel wiring line interconnects the drain region of the reset transistor and the gate electrode of the source follower transistor.

26 Claims, 22 Drawing Sheets

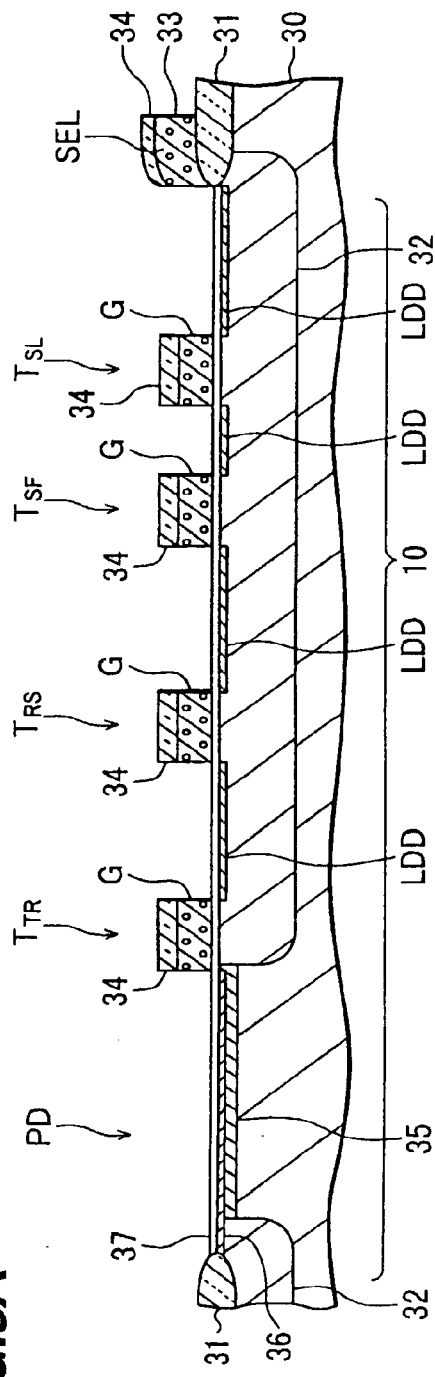
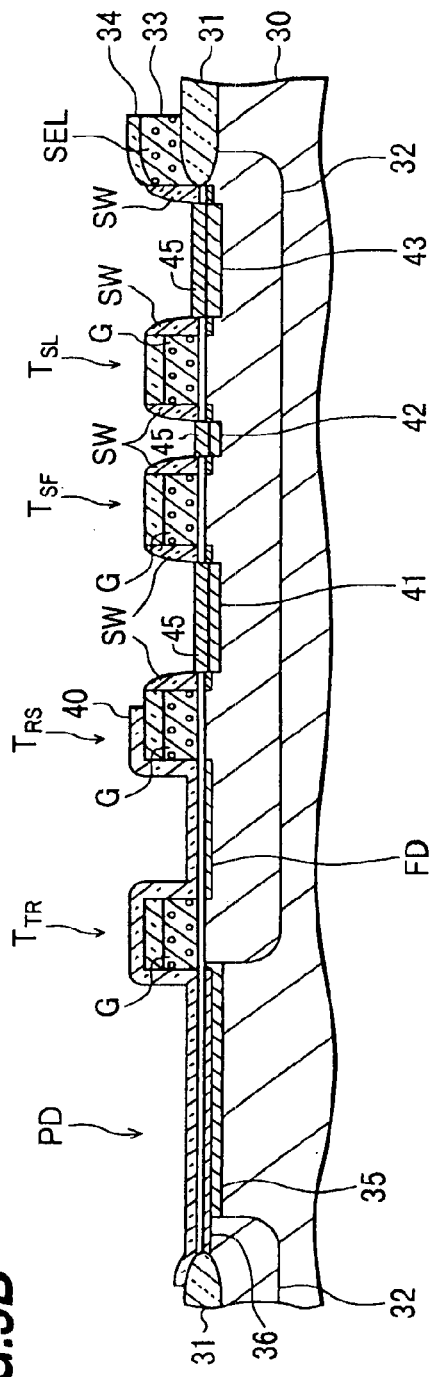
FIG.3A
FIG.3B

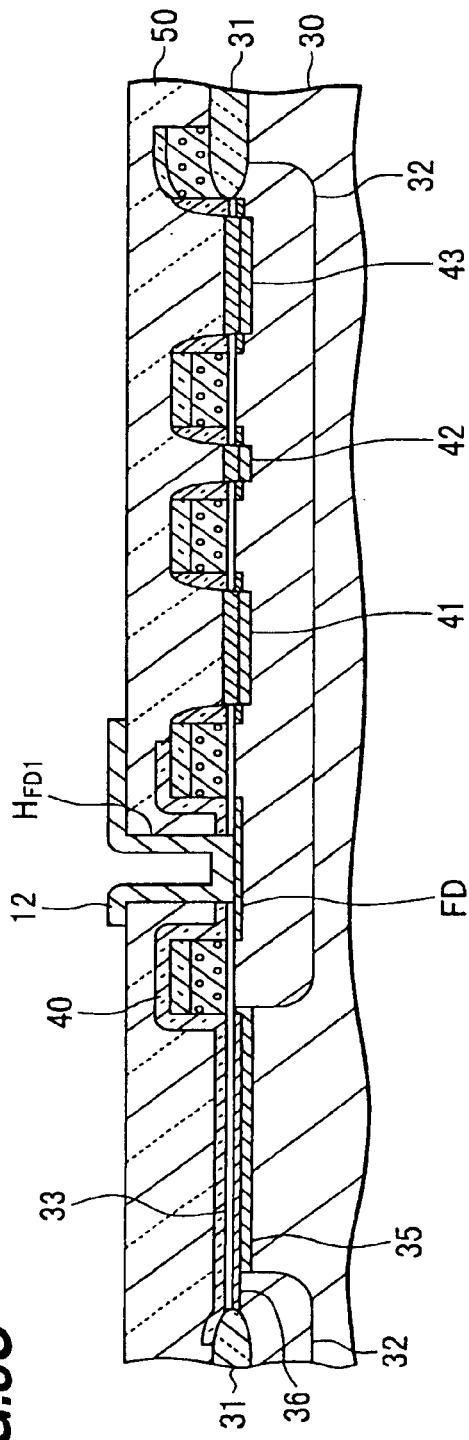
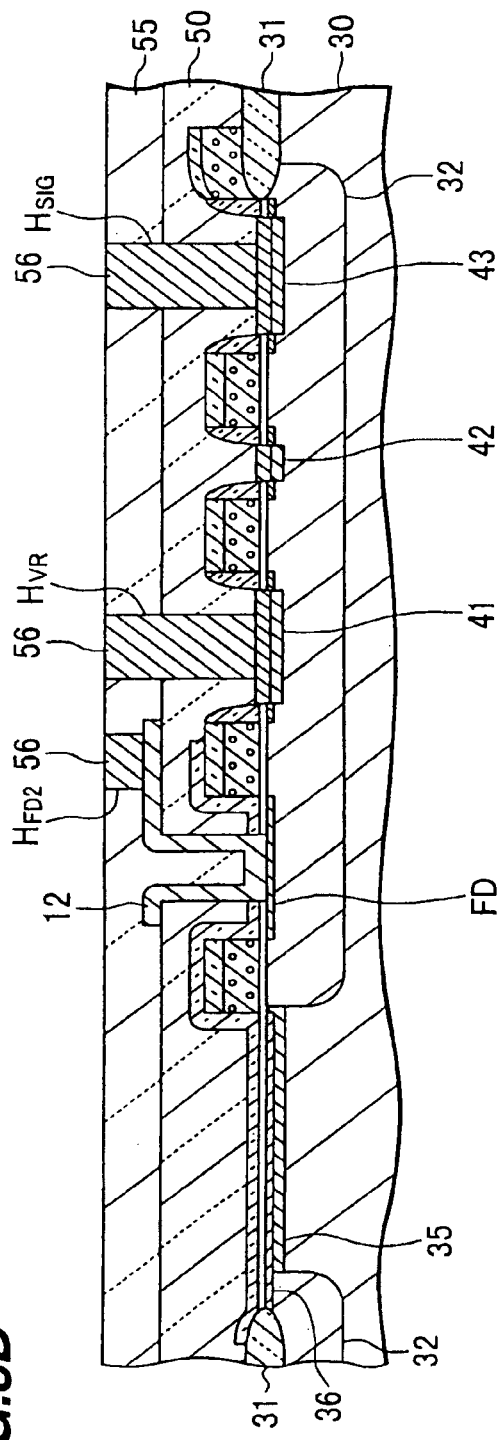
FIG.3C
FIG.3D

SEMICONDUCTOR DEVICE FOR READING SIGNAL FROM PHOTODIODE VIA TRANSISTORS

CROSS REFERENCE TO RELATED APPLICATION

This application is based on Japanese Patent Application No. 2002-251265 filed on Aug. 29, 2002, the entire contents of which are incorporated herein by reference.

BACKGROUND OF THE INVENTION

A) Field of the Invention

The present invention relates to a semiconductor device for reading an electric signal of each of a plurality of pixels disposed on a semiconductor substrate to a signal read line via transistors, the electric signal being photoelectrically converted by a photodiode of the pixel.

B) Description of the Related Art

A solid state imaging device (image sensor) manufactured based upon complimentary MOS (CMOS) processes generally uses an active pixel sensor (APS) in whose pixel is constituted of: a photodiode for conducting photoelectric conversion; a reset transistor for initializing a voltage to be applied to the photodiode; a source follower transistor for converting signal charges of the photodiode into a voltage signal and outputting it; and a select transistor for selecting the pixel to read the voltage signal.

FIG. 13A is a plan view of one pixel of a conventional four-transistor solid state imaging device. Active regions 500 are defined in a silicon substrate. The active region 500 is constituted of: a rectangular area 500A; a projecting area 500B projecting right from the upper right side of the rectangular area 500A as viewed in FIG. 13A; a vertical area 500C extending from the front portion of the projecting area 500B toward the lower portion in FIG. 13A; and a horizontal area 500D extending from the lower edge of the vertical area 500C toward the left as viewed in FIG. 13A.

A photodiode PD is disposed in the rectangular area 500A. The gate electrode of a transfer transistor $T_{TR}$ crosses the vertical area 500C. In the area lower than this cross area, the gate electrode of a reset transistor $T_{RS}$ crosses the vertical area 500C. The gate electrode of a source follower transistor $T_{SF}$ crosses the horizontal area 500D. On the left side of this cross area, the gate electrode of a select transistor $T_{SL}$ crosses the horizontal area 500D.

A via hole $H_{FD}$ interconnecting an impurity diffusion region and the gate electrode of the source follower transistor $T_{SF}$ is disposed between the gate electrodes of the transfer transistor $T_{TR}$ and reset transistor $T_{RS}$. A via hole $H_{RS}$ interconnecting an impurity diffusion region and a reset voltage supply line formed in the upper layer is disposed between the gate electrodes of the reset transistor $T_{RS}$ and source follower transistor $T_{SF}$. A via hole $H_{SIG}$ interconnecting the source region of the select transistor and a signal read line formed in the upper layer is disposed on the left side of the gate electrode of the select transistor $T_{SL}$.

In manufacturing a CMOS solid state imaging device, processes similar to those of manufacturing general logic circuit elements are basically used. Processes (logic processes) of manufacturing logic circuit elements in the generation of 0.35 µm rules or later fill tungsten in such via holes. The gate electrode of each transistor and the via holes are disposed by taking a position misalignment into consideration.

FIG. 13B is a plan view of one pixel of a conventional three-transistor solid state imaging device. A transistor corresponding to the transfer transistor $T_{TR}$ of the four-transistor solid state imaging device shown in FIG. 13A is omitted. The gate electrode of the source follower transistor $T_{SF}$ crosses the vertical area 500C of the active region 500 near at its lower edge. The gate electrode of the select transistor $T_{SL}$ branches from a select signal line SEL formed in the same wiring layer as that of the gate electrode. Instead of the via hole $H_{FD}$, a via hole $H_{PD}$ is disposed for interconnecting the anode of the photodiode PD and the gate electrode of the source follower transistor $T_{SF}$. The other fundamental structures are same as those of the four-transistor CMOS imaging device shown in FIG. 13A.

One pixel of a conventional general CMOS solid state imaging device has a square shape with four equal sides of, e.g., 5.6 µm. Since a photodiode PD and three or four transistors are disposed in one pixel, the area occupied by other than the photodiode PD becomes large and the ratio occupied by the photodiode PD in one pixel becomes small.

If the area of one pixel is made small in order to improve a pixel density, light convergence of a micro lens becomes difficult. Since the area occupied by the photodiode becomes small, incident light is reduced and the sensitivity is lowered.

Signal lines for supplying electric signals to the gates of the four transistors of a four transistor solid state imaging device are disposed in upper layers. Since the upper level wiring lines cannot run in the region where the photodiode PD is disposed, the wiring layout is not easy.

If the aspect ratio of a pixel can be freely selected, the ratio of an area occupied by a photodiode can be raised relatively easily. Generally, the vertical and horizontal pitches of pixels of a solid state are equal and each pixel has a square shape. The aspect ratio of a pixel cannot be therefore freely selected.

A significant issue of a CMOS solid state imaging device is concerned about reduction in junction leak current. A pixel having a large junction leak current becomes a white dot which degrades the image quality. As shown in FIG. 13B, in the case of a three-transistor solid imaging device among others, the plug in the via hole $H_{FD}$ contacts one of electrodes (n-type impurity diffusion regions) of a photodiode PD. This contact of the plug is one factor of increasing junction leak current.

SUMMARY OF THE INVENTION

An object of this invention is to provide a semiconductor device capable of raising a ratio of an area occupied by a photodiode of a pixel.

Another object of the invention is to provide a semiconductor device capable of reducing junction leak current and improving an image quality.

According to one aspect of the present invention, there is provided a semiconductor device comprising: a plurality of pixels disposed over a semiconductor substrate in a matrix shape; wherein: each of the pixels comprises a photodiode, a reset transistor, a source follower transistor and a select transistor; the photodiode comprises an impurity diffusion region of a first conductivity type and an impurity diffusion region of a second conductivity type stacked in a thickness direction; each of the reset transistor, the source follower transistor and the select transistor comprises a pair of impurity diffusion regions of the first conductivity type formed in a surface layer of the semiconductor substrate and having a channel region between the impurity diffusion regions and a gate electrode formed over the channel region; the photodiode, the reset transistor, the source follower transistor and the select transistor are disposed in one active region; the active region comprises a first area in which the photodiode is disposed and a second area having a first end continuous with the first area and including an area elongated along a first direction; and each of gate electrodes of the reset transistor, the source follower transistor and the select transistor crosses the area, elongated along the first direction, of the second area, and a cross area between the gate electrode of the reset transistor and the second region, a cross area between the gate electrode of the source follower transistor and the second region and a cross area between the gate electrode of the select transistor and the second region, are disposed in this order in a direction of departing from the first end, an intra-pixel wiring line for interconnecting the impurity diffusion region of the reset transistor on the first end side and the gate electrode of the source follower transistor of the pixel; a reset voltage supply line connected to the impurity diffusion region between the gate electrodes of the reset transistor and the source follower transistor and being applied with a reset voltage for applying an initial reverse bias to the photodiode; a reset signal line for applying a reset signal to the gate electrode of the reset transistor; a select signal line disposed for each row of the pixels, the select signal line applying a select signal to the gate electrodes of the select transistors of the pixels in a corresponding row; and a signal read line disposed for each column of the pixels and connected to the impurity diffusion regions, on a side opposite to the first end, of the select transistors of the pixels in a corresponding column.

A plurality of transistors are disposed in the active region in the area elongated in the first direction. As compared to the layout which disposes transistors on both sides of a bent area of the active region, the area occupied by transistors can be made small.

DESCRIPTION OF THE PREFERRED EMBODIMENTS

Figure 1A:
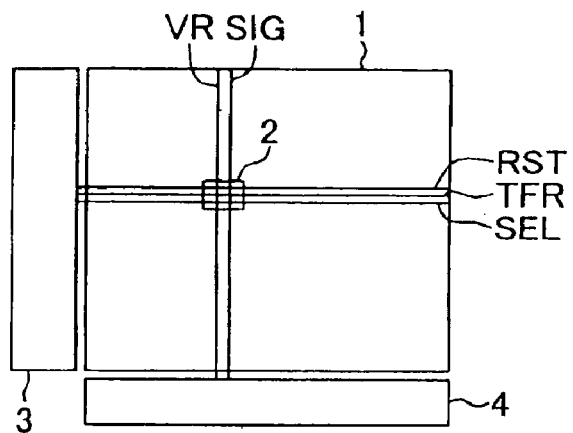
FIG. 1A is a block diagram of a four-transistor solid state imaging device.

FIG. 1A is a block diagram of a four-transistor solid state imaging device (image sensor) according to a first embodiment of the invention. A plurality of pixels 2 are disposed in an imaging area in a matrix shape. In correspondence with each of pixel rows, a reset signal line RST, a transfer signal line TFR and a select signal line SEL are disposed. In correspondence with each of pixel columns, a signal read line SIG and a reset voltage supply line VR are disposed.

A row select circuit 3 sends electric signals to the reset signal line RST, transfer signal line TFR and select signal line SEL at timings to be described later. An image signal is input from each pixel 2 to a read circuit 4 via the signal read line SIG.

Figure 1B:
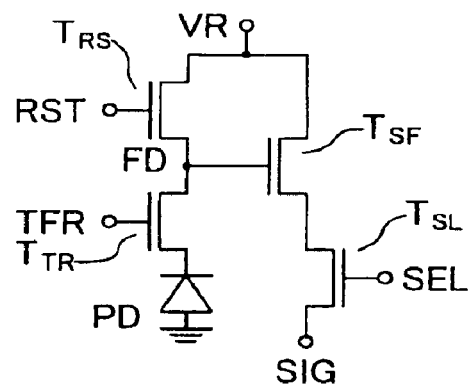
FIG. 1B is an equivalent circuit diagram of the imaging device.

FIG. 1B is an equivalent circuit diagram of one pixel. One pixel comprises a photodiode PD, a transfer transistor $T_{TR}$, a reset transistor $T_{RS}$, a source follower transistor $T_{SF}$ and a select transistor $T_{SL}$. These transistors are all made of n-channel transistors.

The drain terminal of the reset transistor $T_{RS}$ and the drain terminal of the source follower transistor $T_{SF}$ are connected to the reset voltage supply line VR. The drain terminal of the transfer transistor $T_{TR}$ is connected to the source terminal of the reset transistor $T_{RS}$ and the gate electrode of the source follower transistor $T_{SF}$, and the source terminal of the transfer transistor $T_{TR}$ is connected to the cathode of the photodiode PD. An interconnection point between the reset transistor $T_{RS}$ and transfer transistor $T_{TR}$ is called a floating diffusion region FD. The drain terminal of the select transistor $T_{SL}$ is connected to the source terminal of the source follower transistor $T_{SF}$, and the source terminal of the select transistor $T_{SL}$ is connected to the signal read line SIG.

The gate electrodes of the reset transistor $T_{RS}$, transfer transistor $T_{TR}$ and select transistor $T_{SL}$ are connected to the reset signal line RST, transfer signal line TFR and select signal line SEL, respectively. The anode of the photodiode PD is grounded.

Figure 1C:
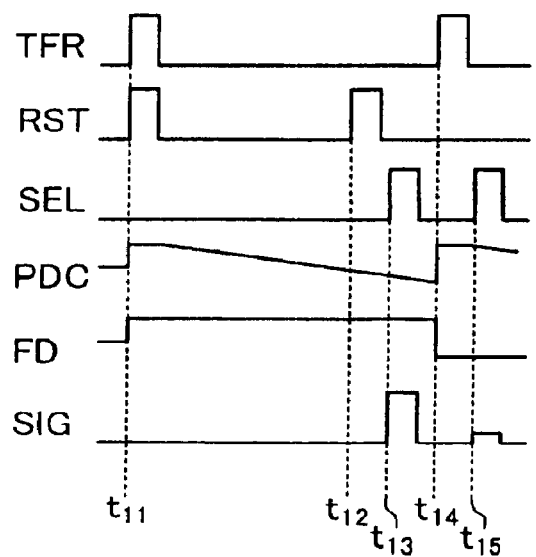
FIG. 1C is a timing chart of the imaging device.

FIG. 1C is a timing chart of various signals. At time $t_{11}$, the transfer signal TFR and reset signal RST rise so that the reset transistor $T_{RS}$ and transfer transistor $T_{TR}$ become conductive. The floating diffusion region FD and a voltage PDC at the cathode of the photodiode PD are therefore initialized to a reset voltage VR.

After the transfer signal TFR and reset signal RST fall and the reset transistor $T_{RS}$ and transfer transistor $T_{TR}$ become non-conductive, the cathode voltage PDC gradually lowers in accordance with the intensity of incidence light upon the photodiode PD. At time $t_{12}$ the reset voltage RST rises. The voltage of the floating diffusion region FD is therefore initialized again to the reset voltage VR.

After the reset signal RST falls, at time $t_{13}$ the select signal SEL rises so that the select transistor $T_{SL}$ becomes conductive. At this time, since the reset voltage is being applied to the gate electrode of the source follower transistor $T_{SF}$, a voltage lower than the reset voltage by a threshold voltage of the source follower transistor $T_{SF}$ is output to the signal read line SIG.

At time $t_{14}$, the transfer signal TFR rises so that the transfer transistor $T_{TR}$ becomes conductive. Signal charges accumulated in the photodiode PD are therefore transferred to the floating diffusion region FD. The voltage of the floating diffusion region FD lowers in accordance with the amount of signal charges, and the voltage PDC at the cathode of the photodiode PD is initialized.

At time $t_{15}$ the select signal SEL rises so that the select transistor $T_{SL}$ becomes conductive. At this time, a voltage corresponding to the amount of signal charges in the floating diffusion region FD is applied to the gate electrode of the source follower transistor $T_{SF}$. As a result, a signal corresponding to the signal charge amount is output to the signal read line SIG.

The read circuit 4 obtains a difference between the voltage output to the signal read line SIG at time $t_{13}$ and the voltage output to the signal read line SIG at time $t_{15}$. By obtaining the voltage difference, the threshold voltage of the source follower transistor $T_{SF}$ is cancelled out and the voltage corresponding to the received light amount can be obtained.

In the timing chart shown in FIG. 1C, the photodiode PD and floating diffusion region FD are initialized at time $t_{11}$ the floating region FD is again initialized at time $t_{12}$ and the photodiode FD is again initialized at time $t_{14}$. Therefore, after the photoelectric conversion starts from the pulse fall at time $T_{14}$, the initialization at time $t_{11}$ is not necessary. After time $t_{15}$, the sequence that the reset signal RST appears at time $t_{12}$ may be repeated.

Figure 2A:
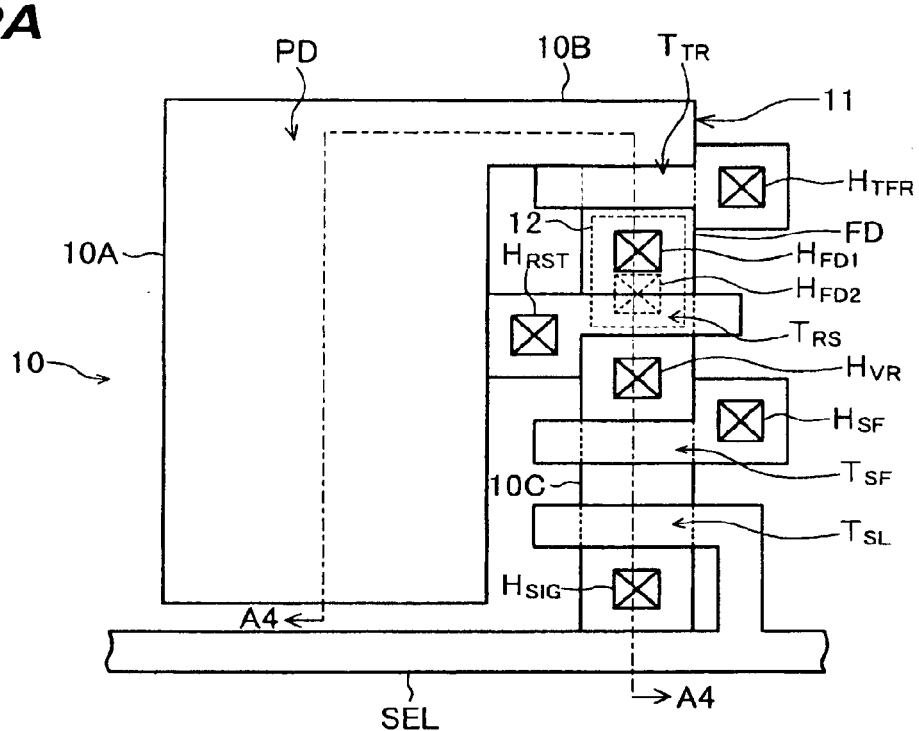
FIGS. 2A to 2D are plan views of the patterns of a gate electrode layer, first- second- and third-level metal wiring layers, respectively, of a solid state imaging device according to a first embodiment.

FIG. 2A is a plan view of one pixel of the solid state imaging device of the first embodiment. An active region 10 is defined by an element separation insulating film in the surface layer of a silicon substrate. The active region 10 is constituted of a rectangular area 10A, a protruding area 10B protruding right from the upper right corner of the rectangular area 10A as viewed in FIG. 2A, and a straight area 10C extending from the edge of the protruding area 10B toward the lower portion in FIG. 2A. The straight area 10C is juxtaposed along the right side of the rectangular area 10A.

The photodiode PD is disposed in the rectangular area 10A. The gate electrodes of the transfer transistor $T_{TR}$, reset transistor $T_{RS}$, source follower transistor $T_{SF}$ and select transistor $T_{SL}$ cross the straight area 10C. Cross areas between the gate electrode of the transfer transistor $T_{TR}$ and the straight area 10C, between the gate electrode of the reset transistor $T_{RS}$ and the straight area 10C, between the gate electrode of the source follower transistor $T_{SF}$ and the straight area 10C and between the gate electrode of the select transistor $T_{SL}$ and the straight area 10C, are sequentially disposed in this order along the direction of departing from the edge (upper side) of the straight area 10C on the rectangular area 10A side.

The impurity diffusion region between the gate electrodes of the transfer transistor $T_{TR}$ and reset transistor $T_{RS}$ corresponds to the floating diffusion region FD shown in FIG. 1B.

A via hole $H_{TFR}$ for the connection to an upper layer transfer signal line is disposed near at the right side edge of the gate electrode of the transfer transistor $T_{TR}$. A via hole $H_{RST}$ for the connection to an upper layer reset signal line is disposed near at the left side edge of the gate electrode of the reset transistor $T_{RS}$. A via hole $H_{SF}$ for the connection to the floating diffusion region FD is disposed near at the right side edge of the gate electrode of the source follower transistor $T_{SF}$.

A via hole $H_{FD1}$ is disposed in an area inside of the floating diffusion region FD. A silicon film 12 on an interlayer insulating film is connected to the floating diffusion region FD via the via hole $H_{FD1}$. A via hole $H_{FD2}$ is disposed through the interlayer insulating film covering the silicon film 12 in an area inside the silicon film 12 and at the position displaced from the via hole $H_{FD1}$.

A via hole $H_{SIG}$ for the connection to an upper layer signal read line is disposed in an area inside the drain region lower than the gate electrode of the source follower transistor $T_{SF}$.

The select signal line SEL extending along the row direction is disposed in the area lower than the active region 10 as viewed in FIG. 2A. The select signal SEL is disposed in the wiring layer same as that of the gate electrode of the select transistor $T_{SL}$, and the gate electrode of the select transistor $T_{SL}$ branches from the select signal line SEL.

Figure 2B:
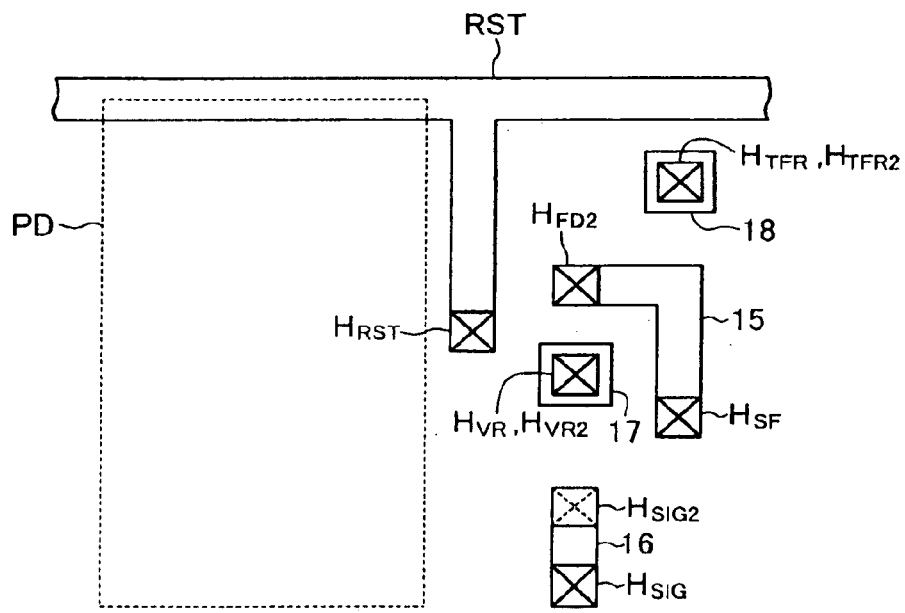

FIG. 2B shows the pattern of the first-level metal wiring layer, i.e., the next upper layer of the silicon film 12.

The reset signal line RST extending along the row direction is disposed along the upper side of the photodiode PD as viewed in FIG. 2B. The reset signal line RST is connected to the gate electrode of the reset transistor $T_{RS}$ in the lower level layer via the conductive plug in the via hole $H_{RST}$.

An inner wiring line 15 interconnects the silicon film 12 and the gate electrode of the source follower transistor $T_{SF}$ shown in FIG. 2A via the conductive plugs in the via holes $H_{FD2}$ and $H_{SF}$. Therefore, the floating diffusion region FD is connected to the gate electrode of the source follower transistor $T_{SF}$ via the silicon film 12, wiring line 15 and the conductive plug in the via hole $H_{SF}$. A wiring line 16 interconnects the via hole $H_{SIG}$ and a via hole $H_{SIG2}$ formed through an upper interlayer insulating film.

An isolated conductive film 17 is disposed on the via hole $H_{VR}$. A via hole $H_{VR2}$ is formed in an interlayer insulating film covering the isolated conductive film 17 at the position same as that of the via hole $H_{VR}$. An isolated conductive film 18 is disposed at the position of the via hole $H_{TFR}$. A via hole $H_{TFR2}$ is formed in the interlayer insulating film covering the isolated conductive film 18 at the position same as that of the via hole $H_{TFR}$.

Figure 2C:
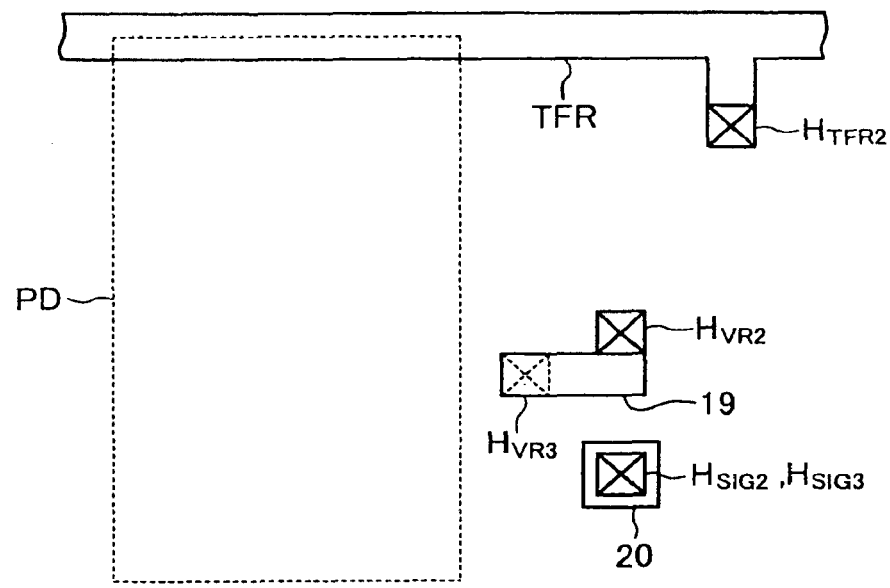

FIG. 2C shows the pattern of the second-level metal wiring layer. A transfer signal line TFR extending in the row direction is disposed along the upper side of the photodiode PD as viewed in FIG. 2C. The transfer signal line TFR is connected to the gate electrode of the transfer transistor $T_{TR}$ shown in FIG. 2A via the conductive plug in the via hole $H_{TFR2}$, the isolated conductive film 18 shown in FIG. 2B and the conductive plug in the via hole $H_{TFR}$.

A wiring line 19 interconnects the conductive plug in the via hole $H_{VR2}$ and the conductive plug in a via hole $H_{VR3}$ formed through an upper level interlayer insulating film. The via hole $H_{VR3}$ is positioned displaced from the via holes $H_{VR2}$ and $H_{SIG2}$ along the row direction.

An isolated conductive film 20 is disposed on the via hole $H_{SIG2}$. A via hole $H_{SIG3}$ is formed in the interlayer insulating film covering the isolated conductive film 20 at the position same as that of the via hole $H_{SIG2}$.

Figure 2D:
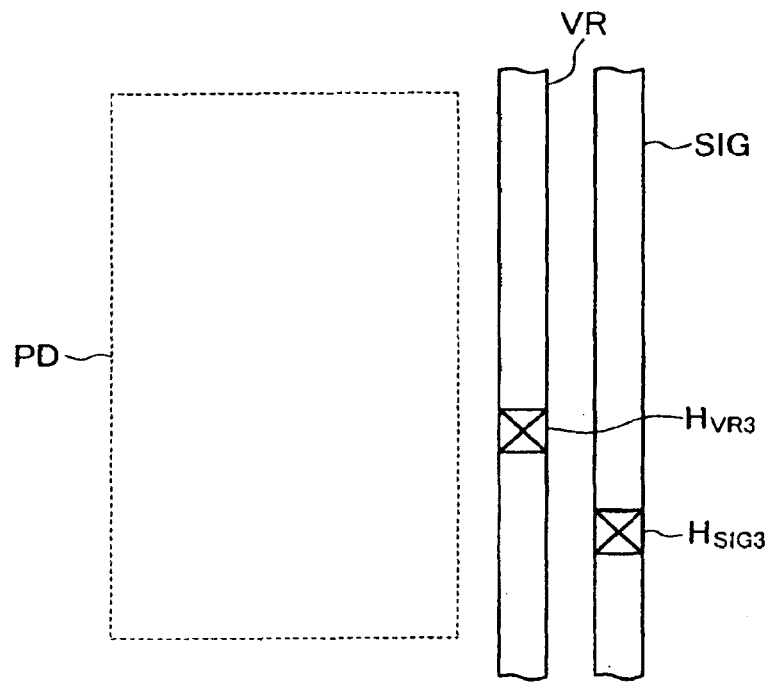

FIG. 2D shows the pattern of the third-level metal wiring layer. A reset voltage supply line VR extending in the column direction is disposed along the right side of the photodiode PD as viewed in FIG. 2D. The reset voltage supply line VR is connected to the drain region of the reset transistor $T_{RS}$ and source follower transistor $T_{SF}$ shown in FIG. 2A, via the conductive plug in the via hole $H_{VR3}$, the wiring line 19 shown in FIG. 2C, the conductive plug in the via hole $H_{VR2}$, the isolated conductive film 17 shown in FIG. 2B and the conductive plug in the via hole $H_{VR}$.

A signal read line SIG extending in the column direction is disposed along the right side of the reset voltage supply line VR. The signal read line SIG is connected to the source region of the select transistor $T_{SL}$, via the conductive plug in the via hole $H_{SIG3}$, the isolated conductive film 20 shown in FIG. 2C, the conductive plug in the via hole $H_{SIG2}$, the wiring line 16 shown in FIG. 2B and the conductive plug in the via hole $H_{SIG}$.

Next, by referring to FIGS. 3A to 3E, a method of manufacturing the solid state imaging device of the first embodiment will be described. Each drawing of FIGS. 3A to 3E corresponds to a cross sectional view taken along one-dot chain line A4—A4 shown in FIG. 2A.

As shown in FIG. 3A, on the surface of a semiconductor substrate 30 made of silicon, an element separation insulating film 31 is formed to a thickness of 250 to 350 nm (a general or main condition of 300 nm) by local oxidation of silicon (LOCOS). The element separation insulating film 31 defines active regions 10. A p-type well 32 is formed in the surface layer of the active region 10 of the semiconductor substrate 30, excepting the region where a photodiode PD is to be formed. The element separation insulating film 31 may be formed by shallow trench isolation (STI) by forming a trench having a depth of about 300 nm.

On the surface of the active region 10, a gate oxide film 37 having a thickness of 3 to 8 nm is formed by thermal oxidation. A silicon film having a thickness of 50 to 100 nm (a general condition of 50 nm) and doped with phosphorous (P) and a tungsten silicide (WSi) film having a thickness of 100 to 200 nm (a general condition of 150 nm) are sequentially formed on the substrate surface by chemical vapor deposition (CVD). In the drawings, these two films are drawn as one gate electrode layer 33. On this gate electrode layer 33, a silicon oxide film 34 having a thickness of 100 to 200 nm (a general condition of 150 nm) is formed by CVD.

The silicon oxide film 34 and gate electrode layer 33 are patterned to leave the gate electrodes G of a transfer transistor $T_{TR}$, a reset transistor $T_{RS}$, a source follower transistor $T_{SF}$ and a select transistor $T_{SL}$. At the same time, a select signal line SEL is left on the element separation insulating film 31. The silicon oxide films 34 remain on the gate electrodes G and select signal line SEL.

By using the gate electrodes G as a mask, phosphorous (P) ions are implanted into the surface layer of the semiconductor substrate 30 under the conditions of an acceleration energy of 10 to 30 keV (a general condition of 20 keV) and a dose of $2 \times 10^{13}$ to $1 \times 10^{14}$ cm$^{-2}$ (a general condition of $4 \times 10^{13}$ cm$^{-2}$). Lightly doped regions LDD of the sources and drains of n-channel MOS transistors are therefore formed.

Phosphorous ions are implanted into the region where the photodiode PD is to be disposed, under the conditions of an acceleration energy of 20 to 300 keV (a general condition of 200 keV) and a dose of $1 \times 10^{12}$ to $5 \times 10^{13}$ cm$^{-2}$ (a general condition of $1 \times 10^{13}$ cm$^{-2}$). An n-type buried layer 35 as the cathode of the photodiode PD is therefore formed. The outer periphery of the n-type buried layer 35 is spaced apart from the border of the element separation insulating film 31 by about 0.2 μm so that the n-type buried layer 35 does not contact the element separation insulating film 31. The border of the n-type buried layer 35 on the transfer transistor $T_{TR}$ side is defined in a self alignment manner by the gate electrode of the transfer transistor $T_{TR}$.

Boron (B) ions are implanted into the region where the photodiode PD is to be disposed, under the conditions of an acceleration energy of 5 to 10 keV and a dose of $1 \times 10^{13}$ to $1 \times 10^{14}$ cm$^{-2}$. BF$_2$ ions may be implanted at an acceleration energy of 30 keV. A p$^+$-type layer 36 as the anode of the photodiode PD is therefore formed. The p$^+$-type layer 36 is maintained at the same potential as that of the p-type well 32 which is grounded. With this ion implantation, the low impurity concentration regions of the sources and drains of p-channel MOS transistors not drawn in FIG. 3A are formed.

Processes up to the state shown in FIG. 3B will be described. On the substrate surface, a silicon nitride film having a thickness of 50 to 150 nm (a general condition of 100 nm) is formed by CVD. The surface of the silicon nitride film, in the region from the upper surface of the photodiode PD to the upper surface of the gate electrode of the reset transistor $T_{RS}$ via the upper surface of the transfer transistor $T_{TR}$, is covered with a resist film. By using this resist film as a mask, the silicon nitride film is anisotropically etched to leave a mask film 40. At this time, sidewall spacers SW are left on the sidewalls of the gate electrodes G.

By using the gate electrodes G, sidewall spacers SW and mask film 40 as a mask, phosphorous ions are implanted under the conditions of an acceleration energy of 10 to 30 keV (a general condition of 20 keV) and a dose of $1 \times 10^{15}$ to $5 \times 10^{15}$ cm$^{-2}$ (a general condition of $2 \times 10^{15}$ cm$^{-2}$). High impurity concentration regions of the sources and drains of the n-channel MOS transistors are therefore formed.

An impurity diffusion region 41 between the gate electrodes G of the reset transistor $T_{RS}$ and source follower transistor $T_{SF}$ functions as the drain region of the two transistors. An impurity diffusion region 42 between the gate electrodes G of the source follower transistor $T_{SF}$ and select transistor $T_{SL}$ functions as the source region of the source follower transistor $T_{SF}$ and the drain region of the select transistor $T_{SL}$. An impurity diffusion region 43 between the gate electrode G of the select transistor $T_{SL}$ and the element separation insulating film 31 functions as the source region of the select transistor $T_{SL}$.

The impurity diffusion region LDD (floating diffusion region FD shown in FIG. 2A) formed between the gate electrodes G of the transfer transistor $T_{TR}$ and reset transistor $T_{RS}$ by the process shown in FIG. 3A functions as the source region of the reset transistor $T_{RS}$ and the drain region of the transfer transistor $T_{TR}$. Of the n-type buried layer 35 formed by the process shown in FIG. 3A, the region near at the gate electrode G of the transfer transistor $T_{TR}$ functions as the source region of the transfer transistor $T_{TR}$.

Ion implantation is performed to form the high impurity concentration regions of the sources and drains of p-channel MOS transistors in a peripheral logic circuit area not shown in FIG. 3B. In this case, boron ions are implanted under the conditions of an acceleration energy of 5 to 10 keV (a general condition of 7 keV) and a dose of $1 \times 10^{15}$ to $5 \times 10^{15}$ cm$^{-2}$ (a general condition of $2 \times 10^{15}$ cm$^{-2}$).

After a metal film of titanium (Ti) or cobalt (Co) is deposited by sputtering, heat treatment is performed to form metal silicide films 45 on the impurity diffusion regions 41, 42 and 43. Unreacted metal films are removed. Since the photodiode PD and floating diffusion region FD are covered with the mask film 40, a metal silicide film is not formed on these regions.

As shown in FIG. 3C, an interlayer insulating film 50 of silicon oxide is formed. The interlayer insulating film 50 is formed by depositing a silicon oxide film having a thickness of 700 to 1500 nm (a general condition of 1000 nm) by plasma CVD and thereafter planarizing the surface of the silicon oxide film by chemical mechanical polishing (CMP).

A via hole $H_{FD1}$ is formed through the interlayer insulating film 50, mask film 40 and gate insulating film 33 to expose the partial surface of the floating diffusion region FD. After the via hole $H_{FD1}$ is formed, phosphorous ions may be implanted into the substrate surface layer exposed on the bottom of the via hole $H_{HF1}$, under the conditions of an acceleration energy of 10 to 50 keV and a dose of $1 \times 10^{13}$ to $1 \times 10^{15}$ cm$^{-2}$.

An amorphous silicon film having a thickness of 50 to 100 nm and doped with phosphorous is formed on the substrate surface by CVD. This. amorphous silicon film is patterned to leave a silicon film 12 in an area including the via hole $H_{FD1}$. The silicon film 12 is connected to the floating diffusion region FD. Instead of the silicon film 12, a film having a two-layer structure may be used which has an amorphous silicon film having a thickness of 50 nm and a tungsten silicide film having a thickness of 100 nm.

As shown in FIG. 3D, on the interlayer insulating film 50, another interlayer insulating film 55 is formed. The interlayer insulating film 55 is formed by depositing a silicon oxide film having a thickness of 300 to 500 nm (a general condition of 500 nm) by plasma CVD and thereafter performing CMP.

Via holes $H_{HF2}$, $H_{VR}$ and $H_{SIG}$ are formed through the interlayer insulating films 55 and 50. Conductive plugs 56 are buried in these via holes. The conductive plugs 56 are formed by depositing a titanium film having a thickness of 10 to 50 nm, a titanium nitride (TiN) film having a thickness of 10 to 100 nm and a tungsten (W) film having a thickness of 100 to 800 nm in this order and thereafter removing unnecessary regions by CMP.

Figure 3E:
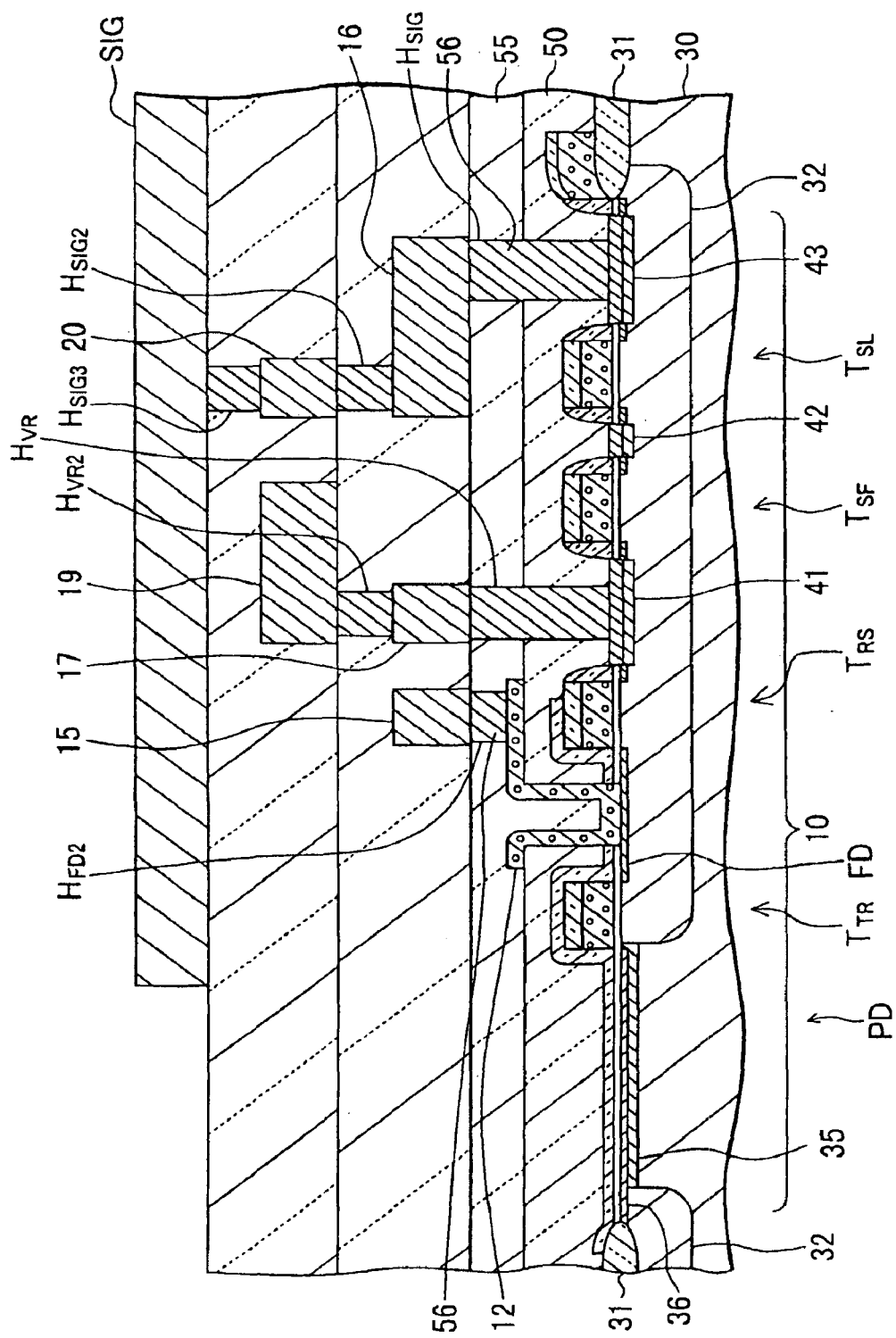
FIGS. 3A to 3D are cross sectional views of a substrate illustrating a method of manufacturing the solid state imaging device of the first embodiment.

As shown in FIG. 3E, on the interlayer insulating film 55, multilevel wiring layers shown in FIGS. 2B, 2C and 2D are formed. Constituent elements shown in FIG. 3E are represented by the same reference symbols as those of corresponding constituent elements shown in FIGS. 2B, 2C and 2D. These multilevel wiring layers can be formed by well-known film formation, photolithography and CMP.

In the first embodiment described above, as shown in FIG. 2A, four transistors are disposed in row in the straight area 10C of the active region 10. In the case of the conventional layouts shown in FIGS. 13A and 13B, the active region 500 where transistors are disposed is bent and the bent portions are occupied by a broad impurity diffusion region. In the first embodiment, there is no bent portion so that the area where transistors are formed can be made small. It is possible to increase the ratio of a photodiode area to a pixel area.

Figure 13A:
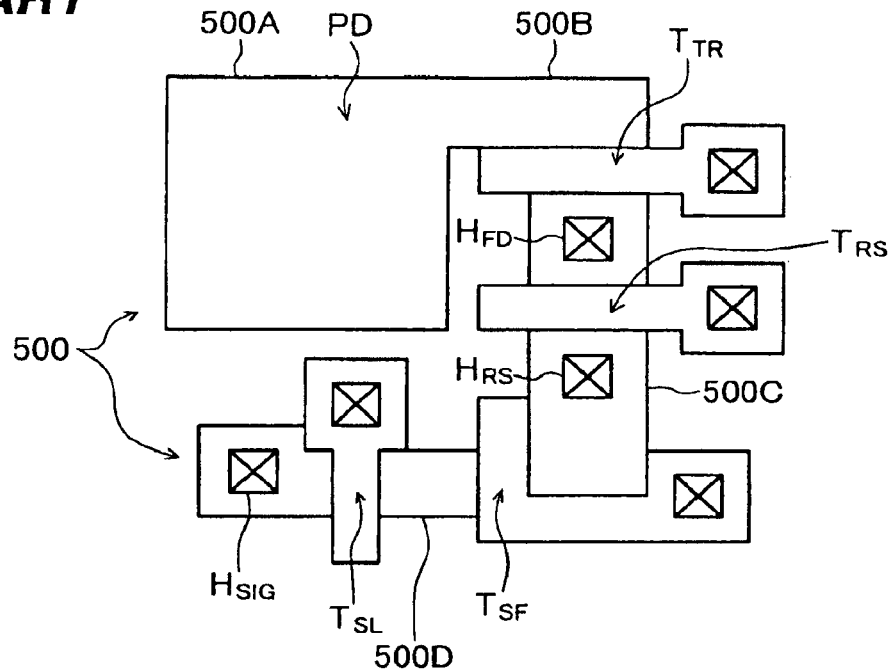
FIGS. 13A and 13B are plan views of the patterns of gate electrode layers of conventional solid state imaging devices.
Figure 13B:
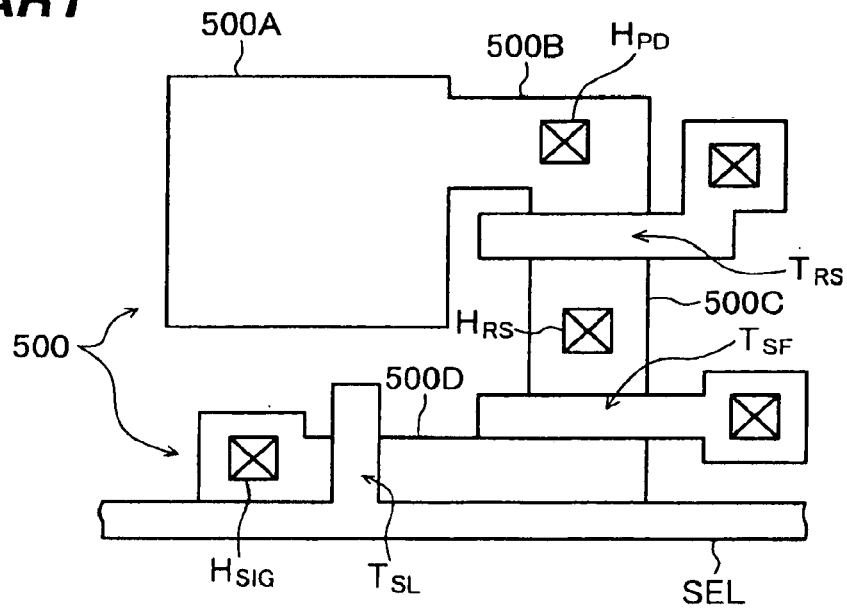

In the conventional four-transistor solid state imaging device shown in FIG. 13A, a ratio of an area occupied by a photodiode to a pixel area was about 20 to 30%. In the first embodiment, a ratio of an area occupied by a photodiode is improved to about 40%.

Also in the first embodiment, as shown in FIG. 2A, the select signal line SEL is formed by using the wiring layer same as that of the gate electrodes of MOS transistors. The select signal line SEL for pixels in the next upper row is disposed above the active region 10 shown in FIG. 2A. Therefore, another wiring line cannot be disposed above the active region 10 shown in FIG. 2A. The select signal line SEL may be formed in an upper wiring layer and the transfer signal line TFR shown in FIG. 2C is formed by using the wiring layer same as that of the gate electrodes.

By forming the select signal line SEL or transfer signal line TFR by using the same wiring layer as that of the gate electrodes of MOS transistors, the layout of an upper layer can be made easy.

Also in the first embodiment, as shown in FIG. 3E, not a plug made of tungsten or the like but the silicon film 12 contacts the floating diffusion region FD. It is therefore possible to prevent an increase in junction leak current to be caused by a contact of a metal plug with the diffusion region. When signal charges corresponding to a light reception amount are transferred to the floating diffusion region FD, a reduction in the signal charges to be caused by junction leak current is not likely to occur. The image quality can be prevented from being degraded.

At the same time when ions are implanted to form the n-type buried layer 35 shown in FIG. 3A, ions may be implanted into the substrate surface layer between the gate electrodes of the transfer transistor $T_{TR}$ and reset transistor $T_{RS}$. With this ion implantation, the floating diffusion region FD shown in FIG. 3E becomes deeper so that junction leak current can be reduced. The floating diffusion region FD may be made deeper by implanting phosphorous ions into the floating diffusion region FD under the conditions of an acceleration energy of 10 to 30 keV and a dose of $1 \times 10^{14}$ to $5 \times 10^{15}$ cm$^{-2}$.

Next, by referring to FIGS. 4A to 4D, a four-transistor solid state imaging device according to a second embodiment will be described.

FIG. 4 is a plan view of one pixel of the four-transistor solid state imaging device of the second embodiment. The layout of an active region 10, each transistor, via holes, and a select signal line SEL is similar to the layout of these elements of the solid state imaging device of the first embodiment shown in FIG. 2A.

Figure 4A:
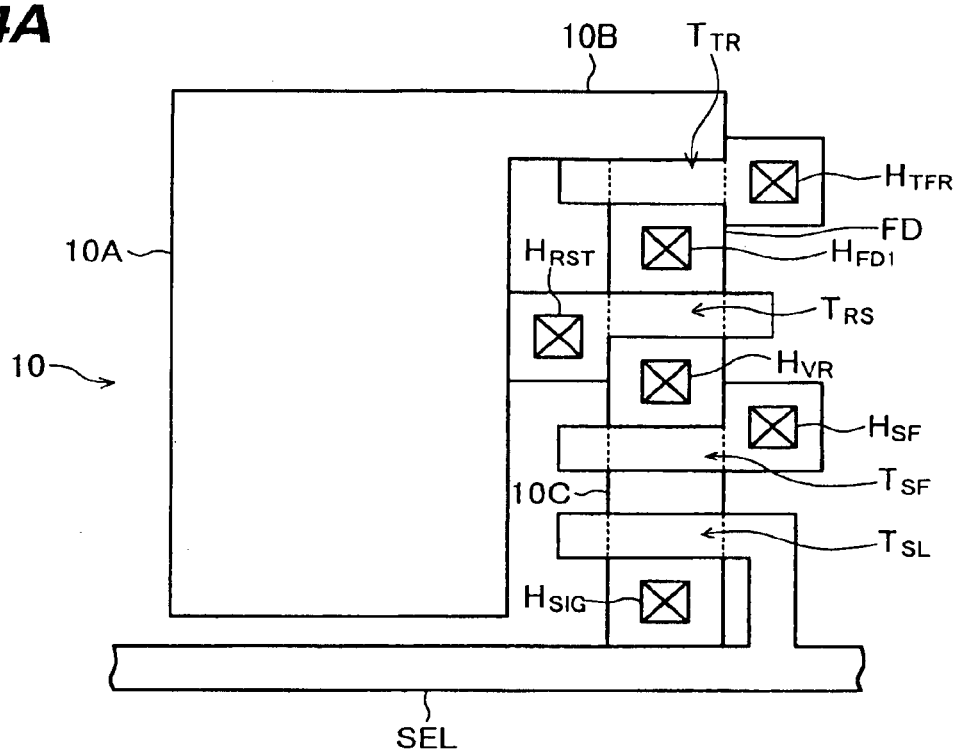
FIGS. 4A to 4D are plan views of the patterns of a gate electrode layer, a silicon wiring layer, first- and second-level wiring layers, respectively, of a solid state imaging device according to a second embodiment.
Figure 4B:
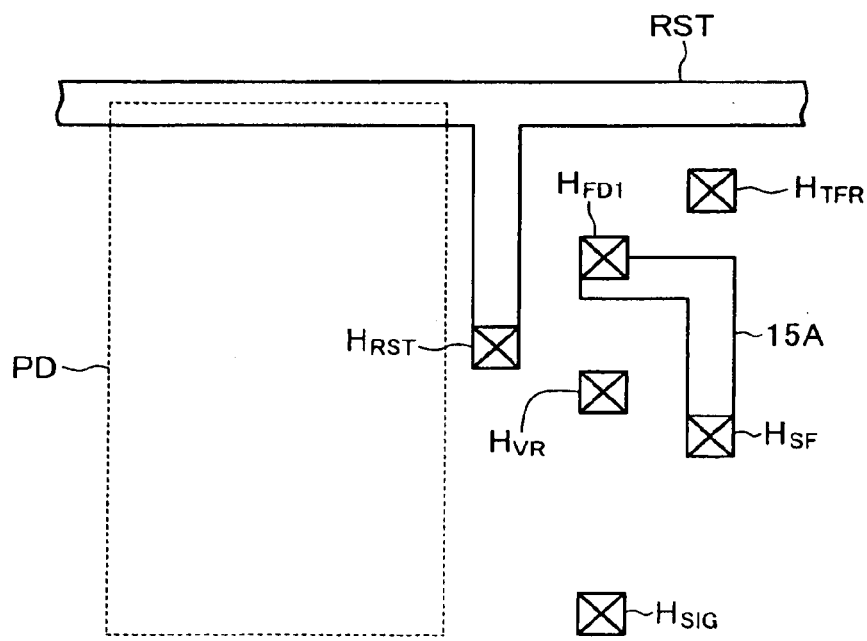

FIG. 4B shows the pattern of a silicon wiring layer corresponding to the silicon film 12 of the first embodiment shown in FIG. 2A. An intra-pixel wiring line 15A is connected to a floating diffusion region FD via a via hole $H_{FD1}$, and to the gate electrode of a source follower transistor $T_{SF}$ via a via hole $H_{SF}$. A reset signal line RST extending in the row direction is connected to the gate electrode of a reset transistor $T_{RS}$ via the via hole $H_{RST}$.

The intra-pixel wiring line 15A and reset signal line RST have a two-layer structure of an amorphous silicon layer having a thickness of 50 nm and doped with phosphorous and a tungsten silicide layer having a thickness of 100 nm.

Figure 4C:
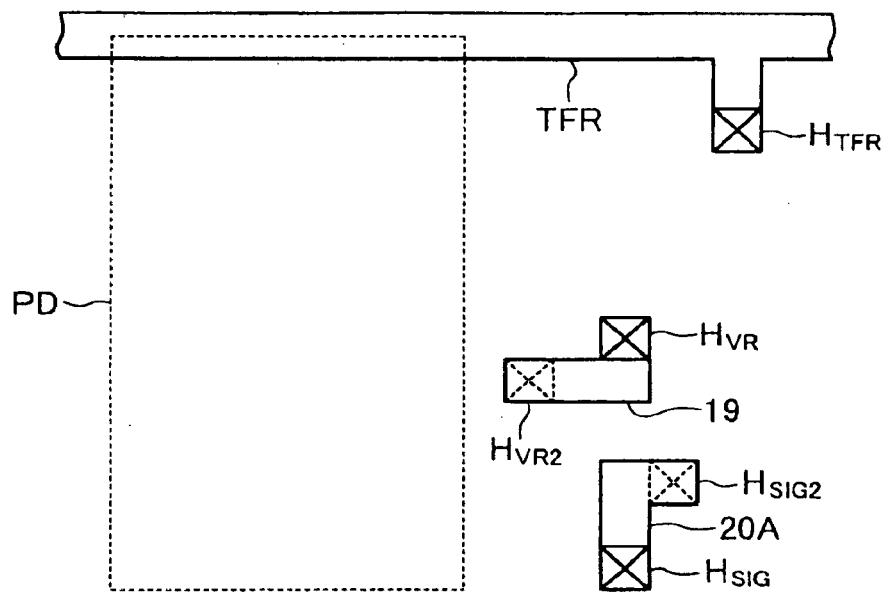

FIG. 4C shows the pattern of a first-level metal wiring layer. This wiring pattern corresponds to the second-level metal wiring pattern of the solid state imaging device of the first embodiment shown in FIG. 2C. In the first embodiment, the via hole $H_{SIG2}$ for interconnecting the first- and second-level metal wiring layers is disposed at the position, as viewed in plan, same as that of the via hole $H_{SIG3}$ for interconnecting the second- and third-level metal wiring layers. In the second embodiment, a via hole $H_{SIG2}$ for interconnecting the first- and second-level metal wiring layers is disposed at the position displaced from an underlying via hole $H_{SIG}$ both in the row and column directions. A wiring line 20A interconnects the conductive plugs buried in the via holes $H_{SIG}$ and $H_{SIG2}$.

Figure 4D:
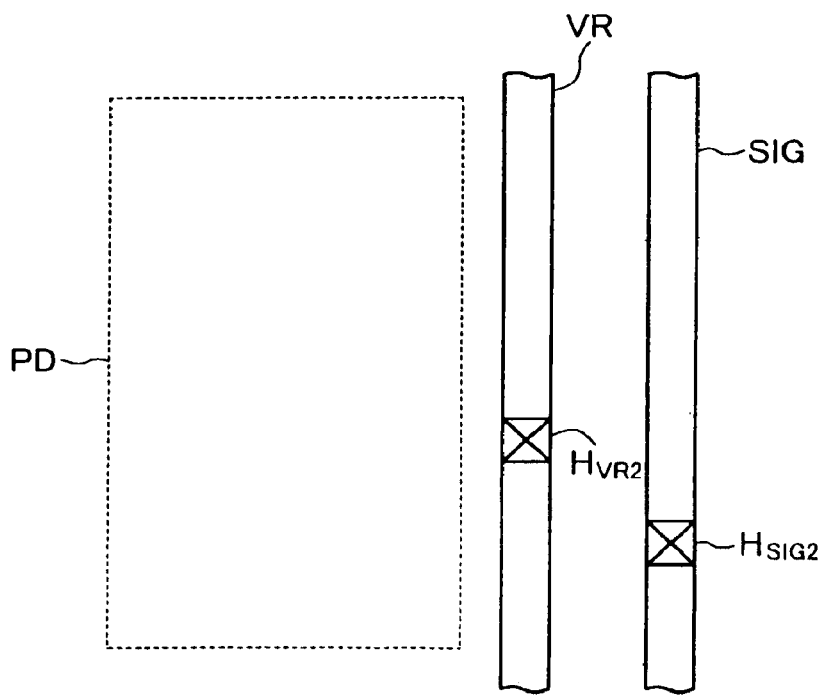

FIG. 4D shows the pattern of a second-level metal wiring layer. This wiring pattern corresponds to the third-level metal wiring pattern of the solid state imaging device of the first embodiment shown in FIG. 2D. Similar to the first embodiment, a reset voltage supply line VR and a signal read line SIG extend in the column direction. As compared to the first embodiment, since the via hole for the signal read line SIG is displaced in the first-level metal wiring layer in the row direction, a space between the reset voltage supply line VR and signal read line SIG is broader.

Also in the second embodiment, the intra-pixel wiring line 15A of silicon shown in FIG. 4B is connected to the floating diffusion region FD shown in FIG. 4A. Since a conductive plug made of metal does not contact the floating diffusion region FD, an increase in junction leak current can be suppressed.

The first embodiment requires three metal wiring layers. In the second embodiment, the wiring layer having the two-layer structure of the silicon layer and tungsten layer shown in FIG. 4B functions as both the silicon film 12 of the first embodiment shown in FIG. 2A and the first-level metal wiring layer shown in FIG. 2B. It is sufficient for the second embodiment to use two metal wiring layers.

Next, by referring to FIGS. 5A to 6E, a four-transistor solid state imaging device according to a third embodiment will be described.

Figure 5A:
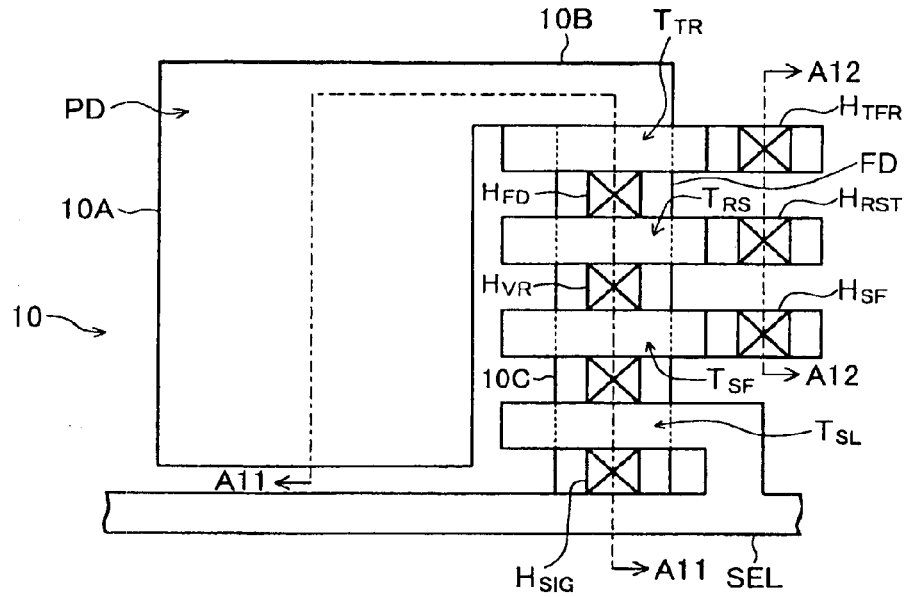
FIGS. 5A to 5D are plan views of the patterns of a gate electrode layer, first- second- and third-level wiring layers, respectively, of a solid state imaging device according to a third embodiment.

FIG. 5A is a plan view of one pixel of the solid state imaging device of the third embodiment. Description will be given on different points from the structure of the solid state imaging device of the first embodiment shown in FIG. 2A.

In the first embodiment, the gate electrodes of the transistors and the via holes above the impurity diffusion region are disposed with some position alignment margin. In the third embodiment, as will be later described, via holes are formed in self alignment with gate electrodes. Therefore, the distance between the gates of a transfer transistor $T_{TR}$, a reset transistor $T_{RS}$, a source follower transistor $T_{SF}$ and a select transistor $T_{SL}$ is shorter than the distance between the gates of the first embodiment shown in FIG. 2A. Further, via holes $H_{TFR}$, $H_{RST}$ and $H_{SF}$ for interconnecting gate electrodes and upper wiring layers are disposed with no position alignment margin relative to the width direction of the gate electrodes (channel length direction, carrier transport direction).

The via holes $H_{TRF}$, $H_{RST}$ and $H_{SF}$ for interconnecting the transfer transistor $T_{TR}$, reset transistor $T_{RS}$ and source follower transistor $T_{SF}$ and the upper wiring layers are disposed at the same position in the row direction.

Figure 5B:
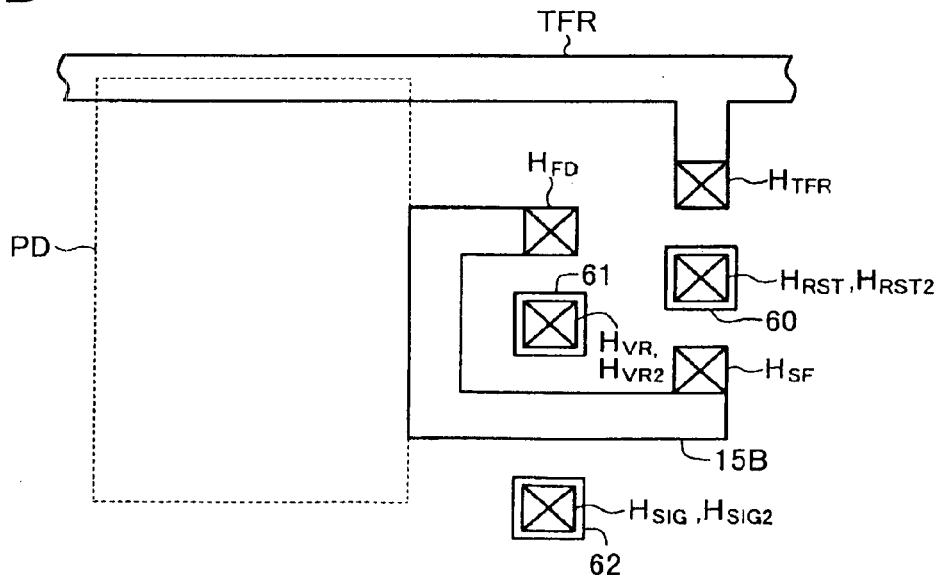

FIG. 5B shows the pattern of a first-level metal wiring layer, i.e., the next upper layer of the gate electrode layer. A transfer signal line TFR extending in the row direction is disposed along the upper side of a photodiode PD as viewed in FIG. 5B. The transfer signal line TFR is connected to the gate electrode of the transfer transistor $T_{TR}$ via the conductive plug in the via hole $H_{TFR}$. An intra-pixel wiring line 15B is connected to a floating diffusion region FD via the conductive plug in a via hole $H_{FD}$, and to the gate electrode of the source follower transistor $T_{SF}$ via the conductive plug in the via hole $H_{SF}$.

An isolated conductive film 60 is disposed in an area corresponding to the via hole $H_{RST}$, and a via hole $H_{RST2}$ is formed in the next upper interlayer insulating film. An isolated conductive film 61 is disposed in an area corresponding to a via hole $H_{VR}$, and a via hole $H_{VR2}$ is formed in the next upper interlayer insulating film. An isolated conductive film 62 is disposed in an area corresponding to a via hole $H_{SIG}$, and a via hole $H_{SIG2}$ is formed in the next upper interlayer insulating film.

Figure 5C:
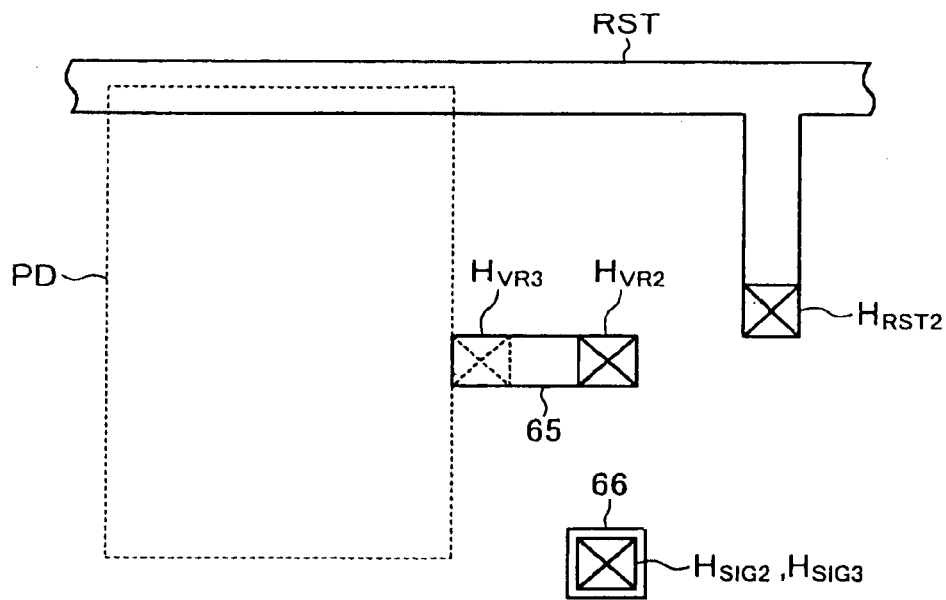

FIG. 5C shows the pattern of a second-level metal wiring layer. A reset signal line RST extending in the column direction is disposed along the upper side of the photodiode PD as viewed in FIG. 5C. The reset signal line RST is connected to the gate electrode of the reset transistor $T_{RS}$ via the conductive plug in the via hole $H_{RST2}$, the isolated conductive film 60 shown in FIG. 5B and the conductive plug in the via hole $H_{RST}$.

A via hole $H_{VR3}$ is disposed in the next upper interlayer insulating film at the position displaced from the via hole $H_{VR2}$. A wiring line 65 interconnects the conductive plugs in the two via holes $H_{VR2}$ and $H_{VR3}$. An isolated conductive film 66 is disposed at the position corresponding to the via hole $H_{S1G2}$, and a via hole $H_{SIG3}$ is formed in the next upper interlayer insulating film.

Figure 5D:
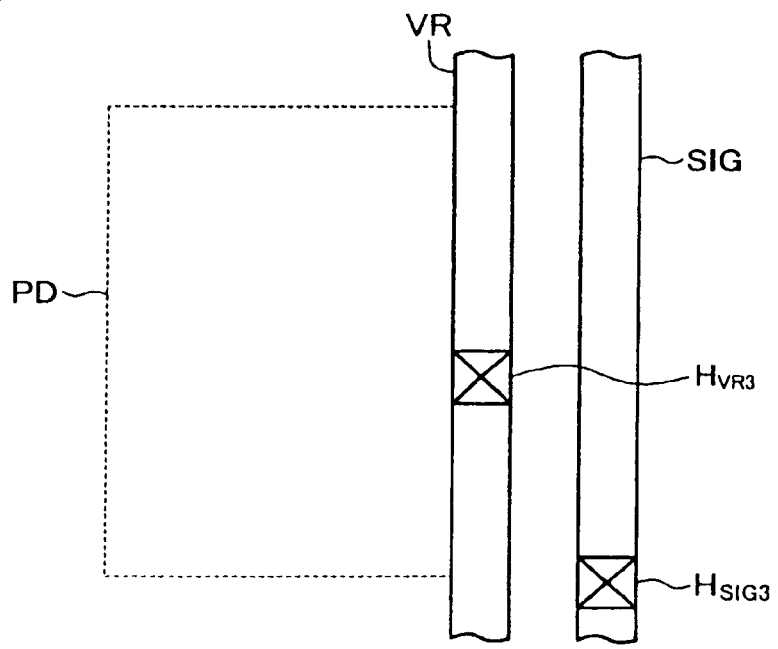

FIG. 5D shows the pattern of a third-level metal wiring layer. A reset voltage supply line VR extending in the column direction is disposed along the right side of the photodiode PD as viewed in FIG. 5D. The reset voltage supply line VR is connected to the common drain region of the reset transistor $T_{RS}$ and source follower transistor $T_{SF}$ shown in FIG. 5A, via the conductive plug in the via hole $H_{VR3}$, the wiring line 65 shown in FIG. 5C, the conductive plug in the via hole $H_{VR2}$, the isolated conductive film 61 shown in FIG. 5B and the conductive plug in the via hole $H_{VR}$.

A signal read line SIG extending in the column direction is disposed along the right side of the reset voltage supply line VR. The signal read line SIG is connected to the source region of the select transistor $T_{SL}$, via the conductive plug in the via hole $H_{SIG3}$, the isolated conductive film 66 shown in FIG. 5C, the conductive plug in the via hole $H_{SIG2}$, the isolated conductive film 62 shown in FIG. 5B and the conductive plug in the via hole $H_{SIG}$.

Next, by referring to FIGS. 6A to 6E, a method of manufacturing the solid state imaging device of the third embodiment will be described. FIGS. 6A to 6C and FIG. 6E correspond to a cross sectional view taken along one-dot chain line A11—A11 shown in FIG. 5A, and FIG. 6D corresponds to a cross sectional view taken along one-dot chain line A12—A12 shown in FIG. 5A.

Figure 6A:
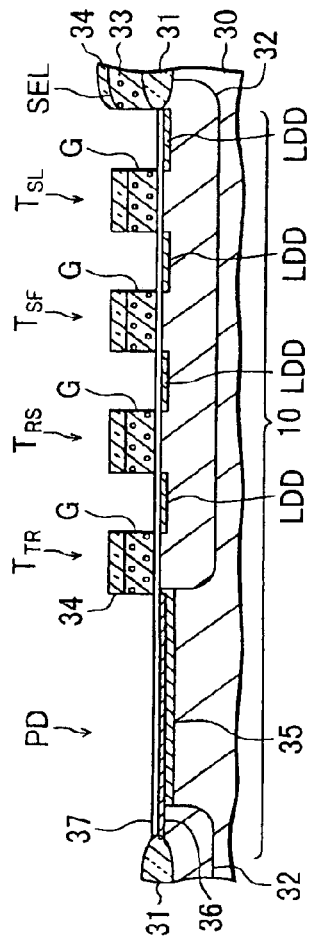
FIGS. 6A to 6E are cross sectional views of a substrate illustrating a method of manufacturing the solid state imaging device of the third embodiment.

As shown in FIG. 6A, on the surface of a silicon substrate 30, an element separation insulating film 31 is formed which defines active regions 10. A p-type well 32 is formed in the surface layer of the active region 10 of the semiconductor substrate 30, excepting the region where a photodiode PD is to be formed. In and above the surface layer of the active region 10, an n-type buried layer 35, low impurity concentration regions LDD of the sources and drains of MOS transistors, a $p^+$-type layer 36, a gate oxide film 37, gate electrodes G of MOS transistors and a silicon oxide film 34 are formed. The main manufacture processes described above are similar to the processes of forming the structure of the first embodiment shown in FIG. 3A.

Figure 6B:
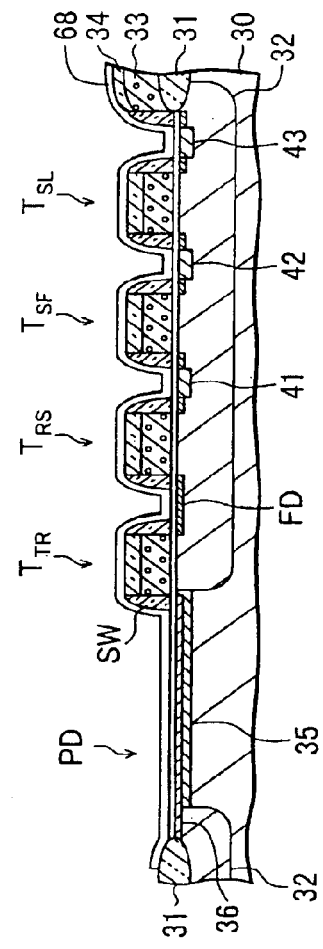

Different points from the manufacture processes of the first embodiment will be described hereinunder. After the silicon oxide film 34 is formed, the silicon oxide film 34 is removed from the areas where via holes for interconnecting the gate electrodes G to upper wiring layers are to be formed. Thereafter, the silicon oxide film 34 and gate electrode layer 33 are patterned to leave the gate electrodes G and a select signal line SEL. The silicon oxide films 34 remain on the gate electrodes G traversing the active region 10 as shown in FIG. 6A. As shown in FIG. 6D, in the areas where the via holes are to be formed, the silicon oxide films on the upper surfaces of the gate electrodes G are removed. The distance between gate electrodes G is shorter than that of the first embodiment shown in FIG. 3A.

Processes up to the state shown in FIG. 6B will be described. On the substrate surface, a silicon nitride film having a thickness of 50 to 150 nm is formed by CVD. The silicon nitride film is anisotropically etched to leave sidewall spacers SW on the sidewalls of the gate electrodes G. As shown in FIG. 6D, the sidewall spacers SW are also formed on the sidewalls of the gate electrodes G above the element separation insulating film 31.

A resist film is formed covering the region from the upper surface of the photodiode PD to the upper surface of the gate electrode of the reset transistor $T_{RS}$ via the upper surface of the transfer transistor $T_{TR}$. By using this resist film, gate electrodes G and sidewall spacers SW as a mask, phosphorous ions are implanted under the conditions of an acceleration energy of 10 to 30 keV (a general condition of 20 keV) and a dose of $1 \times 10^{15}$ to $5 \times 10^{15}$ cm$^{-2}$. High impurity concentration regions 41, 42 and 43 of the sources and drains of the n-channel MOS transistors are therefore formed.

In this embodiment, only the ion implantation for the low impurity concentration regions LDD is performed relative to the floating diffusion region FD between the gate electrodes G of the transfer transistor $T_{TR}$ and reset transistor $T_{RS}$. The ion implantation for the high impurity concentration regions may be performed in some cases relative to the floating diffusion region FD.

Covering the whole substrate surface, a silicon oxide film 68 having a thickness of 20 nm is formed by CVD. By covering the pixel area with a resist film, the silicon oxide film 68 is anisotropically etched. With this etching, the silicon oxide film 68 remains on the sidewalls of the gate electrodes of MOS transistors in a peripheral logic circuit area not shown in FIG. 6B. Namely, in the peripheral logic circuit area, the sidewall spacers SW and silicon oxide films 68 are left.

Ion implantation is performed to form high impurity concentration regions of the sources and drains of p-channel MOS transistors. In this case, boron ions are implanted under the conditions of an acceleration energy of 5 to 10 keV (a general condition of 7 keV) and a dose of $1 \times 10^{15}$ to $5 \times 10^{15}$ cm$^{-2}$.

After a metal film of titanium or cobalt is deposited, heat treatment is performed to form metal silicide films on the surfaces of the sources and drains in the peripheral logic circuit area not covered with the silicon oxide film 68. The metal silicide film is not formed on the surfaces of the sources and drains of MOS transistors of each pixel and on the surface of the photodiode PD. After the heat treatment, unreacted metal films are removed.

Figure 6C:
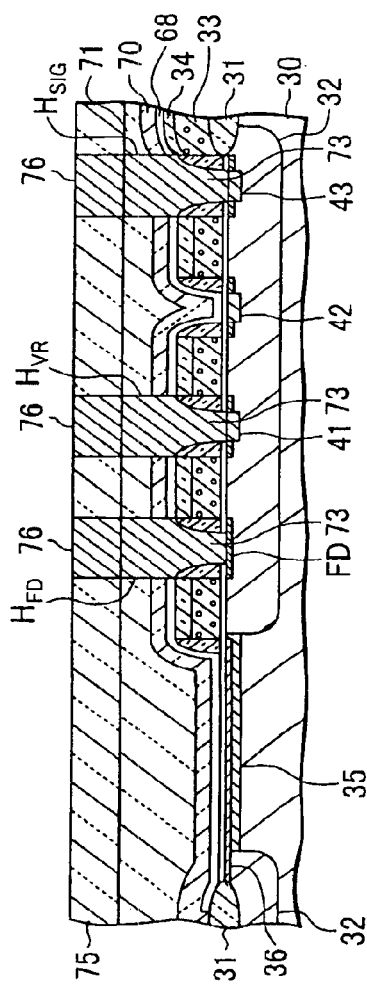
Figure 6D:
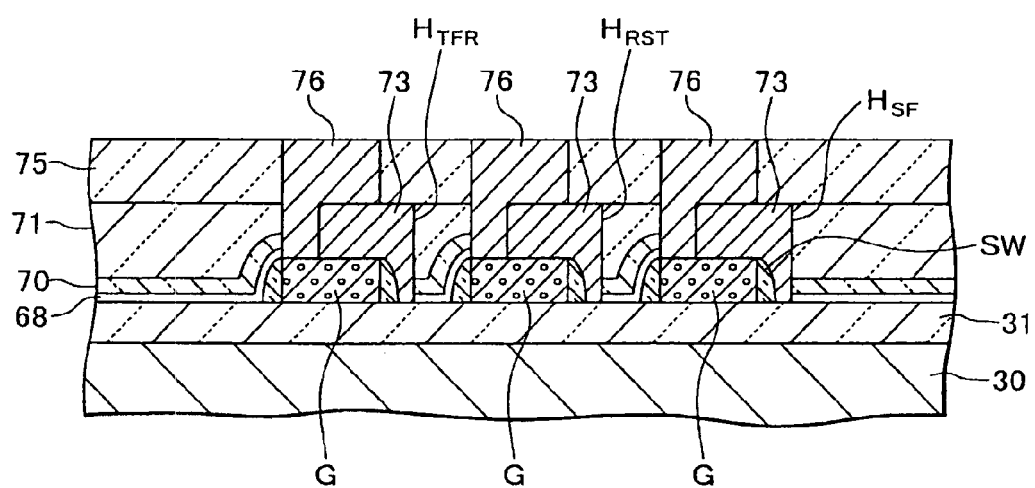

As shown in FIGS. 6C and 6D, covering the whole substrate surface, an etching stopper film 70 made of silicon nitride and having a thickness of 70 nm is formed by plasma CVD or low pressure CVD. On this etching stopper film 70, an interlayer insulating film 71 made of silicon oxide and having a thickness of 700 to 1500 nm (a general condition of 1000 nm) is formed by CVD. The surface of the interlayer insulating film 71 is planarized by CMP.

Via holes $H_{FD}$, $H_{VR}$, $H_{SIG}$, $H_{TFR}$, $H_{RST}$ and $H_{SF}$ are formed through the interlayer insulating film 71. In this case, the interlayer insulating film 71 is selectively etched relative to the etching stopper film 70 in such as manner that the etching stops when the etching stopper film 70 is exposed. The etching stopper films 70 exposed on the bottoms of the via holes $H_{FD}$, $H_{VR}$, $H_{SIG}$, $H_{TFR}$, $H_{RST}$ and $H_{SF}$ are removed to expose the underlying silicon oxide films 68. The exposed silicon oxide films 68 are etched to expose the surfaces of the floating diffusion region FD and impurity diffusion regions 41, 42 and 43.

The silicon oxide film 68 is very thin as compared to the silicon oxide film 34 on the gate electrode G formed by the process shown in FIG. 6A and the sidewall spacer SW. It is therefore possible to leave the silicon oxide film 34 and sidewall spacer SW with a good reproductivity.

Even if there is position misalignment of the via holes $H_{FD}$, $H_{VR}$ and $H_{SIG}$, the gate electrodes G will not be exposed in the via holes $H_{FD}$, $H_{VR}$ and $H_{SIG}$ because the gate electrode G is covered with the silicon oxide film 34 and sidewall spacers SW. Namely, the via holes $H_{FD}$, $H_{VR}$ and $H_{SIG}$ are formed in self alignment with the gate electrodes G. Such structure is referred to as self-aligned contact structure. As shown in FIG. 5A, the via holes $H_{FD}$, $H_{VR}$ and $H_{SIG}$ are disposed with a position misalignment margin relative to the outer periphery of the active region 10.

As shown in FIG. 6D, in the region where the gate electrode G is connected to the upper wiring layer, the silicon oxide film 34 on the gate electrode G is removed in advance. Therefore, the upper surfaces of the gate electrodes G are exposed in the via holes $H_{TFR}$, $H_{RST}$ and $H_{SF}$. The via holes $H_{TFR}$, $H_{RST}$ and $H_{SF}$ are slightly displaced from the ideal positions to the right side as viewed in FIG. 6D and the element separation insulating film 31 is exposed on the bottoms of the via holes $H_{TFR}$, $H_{RST}$ and $H_{SF}$. Since the silicon oxide film 68 is thin, the element separation insulating film 31 will not be etched greatly even if there is position misalignment.

A doped amorphous silicon film having a thickness of about 300 nm is formed and CMP is performed to leave conductive plugs in the via holes $H_{FD}$, $H_{VR}$, $H_{SIG}$ $H_{TFR}$, $H_{RST}$ and $H_{SF}$.

An interlayer insulating film 75 of silicon oxide having a thickness of 200 to 500 nm (a general condition of 500 nm) is formed on the interlayer insulating film 71 by plasma CVD. By etching the interlayer insulating films 75 and 71, via holes are formed in such a manner that the etching stops at the etching stopper film 70. The etching stopper film 70 exposed on the bottoms of the via holes is removed.

The etching stops at the upper surface of the conductive plugs 73, if as shown in FIG. 6C there is no position misalignment between the via holes $H_{FD}$, $H_{VR}$, $H_{SIG}$ formed through the lower interlayer insulating film 71 and the via holes formed in the upper interlayer insulating film 75.

However, as shown in FIG. 6D, if there is position misalignment between the via holes $H_{TFR}$, $H_{RST}$ and $H_{SF}$ formed through the lower interlayer insulating film 71 and the via holes formed in the upper interlayer insulating film 75, the etching advances to the bottom surface of the etching stopper film 70 and the silicon oxide film 68 is exposed.

At the same time when these via holes are formed, via holes at the positions corresponding to the source and drain regions of MOS transistors in the peripheral logic circuit area are formed. The silicon oxide film 68 was already removed in the peripheral logic circuit area. Therefore, the surfaces of the source and drain regions of MOS transistors are exposed on the bottoms of the via holes formed through the interlayer insulating films 75 and 71 and etching stopper film 70.

Next, via holes are formed for interconnecting the gate electrodes of MOS transistors in the peripheral logic circuit area to upper wiring layers. The silicon oxide film 34 of the gate electrode shown in FIG. 6A is left on the gate electrode of each MOS transistor in the peripheral logic circuit area. Therefore, after the via holes are formed through the interlayer insulating films 75 and 71, the etching stopper film 70 left on the bottom of each via hole is removed, and then the silicon oxide film 34 on the gate electrode is removed.

Covering the whole substrate surface, an adhesion layer of titanium having a thickness of 10 to 50 nm, a barrier metal layer of titanium nitride having a thickness of 10 to 100 nm and a conductive layer of tungsten having a thickness of 100 to 800 nm are formed. These three layers are subjected to CMP to leave conductive plugs 76 in the via holes.

Figure 6E:
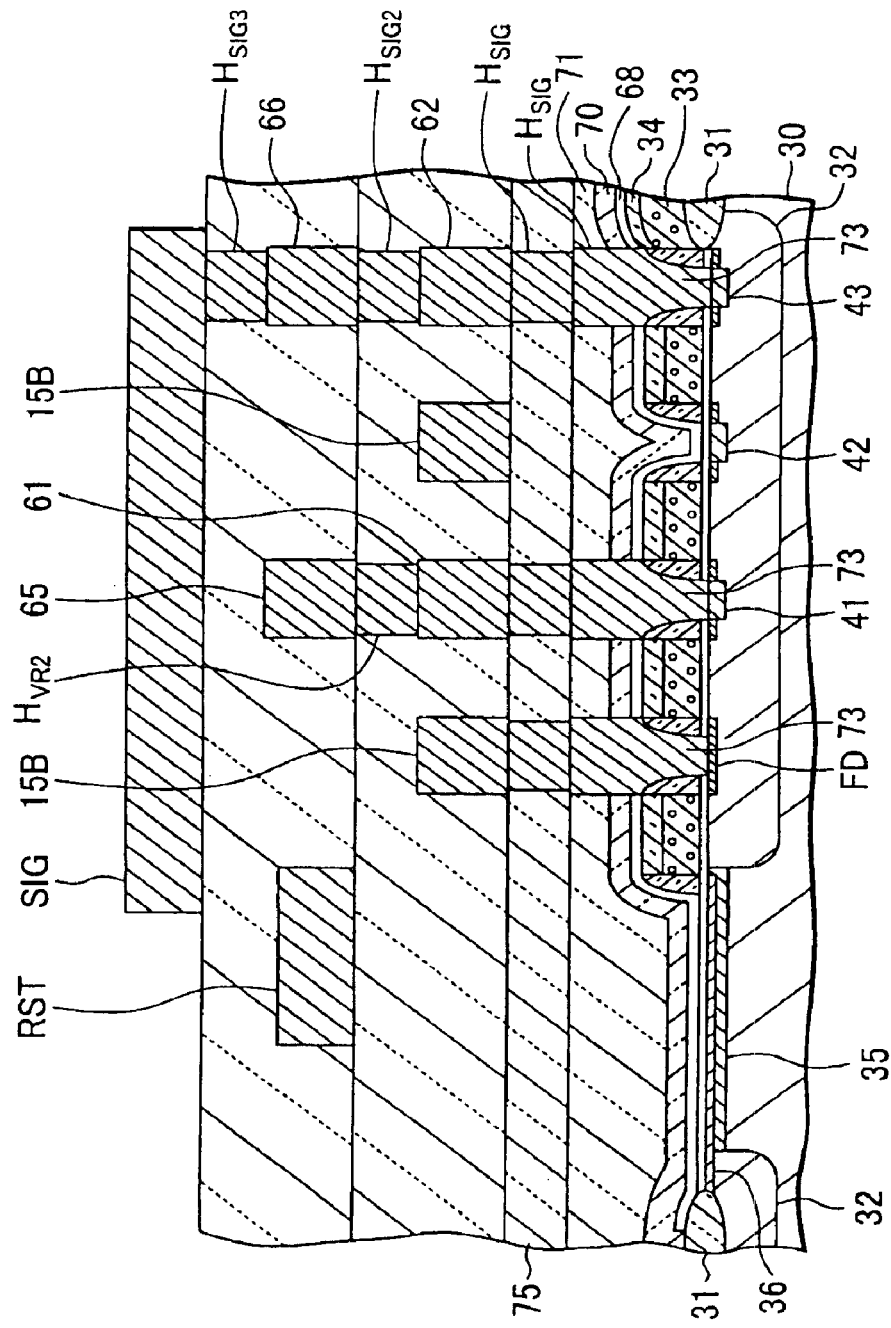

As shown in FIG. 6E, on the interlayer insulating film 75, a first-level metal wiring layer is formed. Each wiring line in the first-level metal wiring layer is made of an aluminum alloy film having a thickness of 400 to 1000 nm. The first-level metal wiring layer includes an intra-pixel wiring line 15B and isolated conductive films 61 and 62.

On the first-level metal wiring layer, a second-level metal wiring layer shown in FIG. 5C and a third-level wiring line shown in FIG. 5D are formed.

In the third embodiment, the distance between gate electrodes of the four transistors of the pixel can be shortened. The pixel area can therefore be reduced. Since the area of the floating diffusion region among others can be reduced, a sensitivity of converting signal charges into a voltage signal can be raised.

Figure 7A:
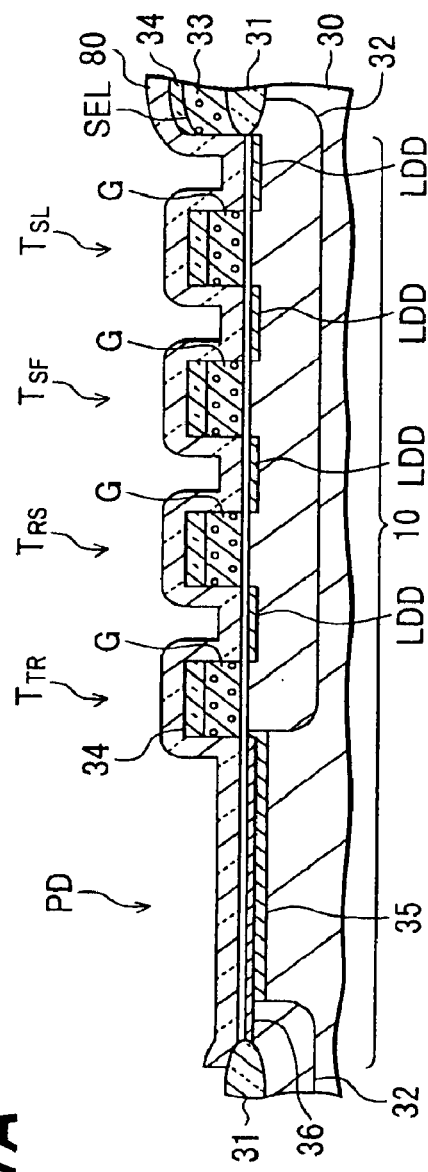
FIGS. 7A to 7C are cross sectional views of a substrate illustrating a method of manufacturing a solid state imaging device according to a fourth embodiment.
Figure 7B:
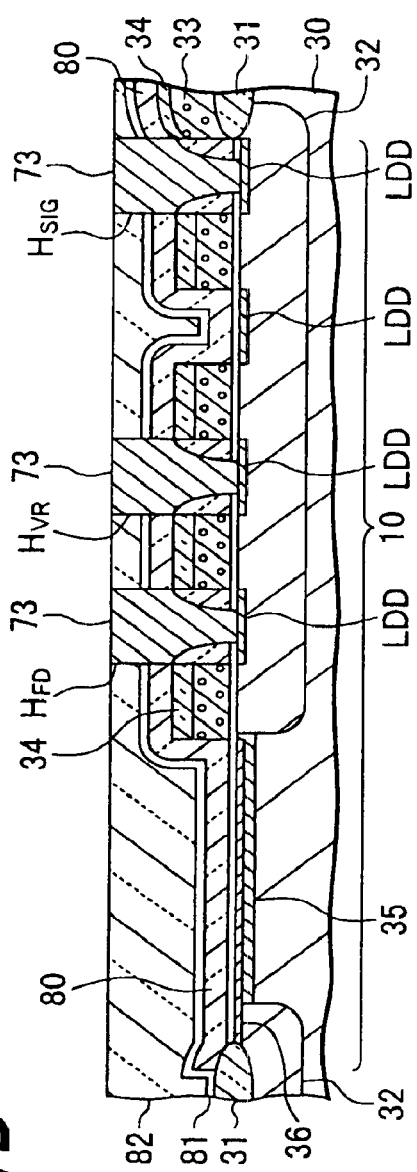

Next, by referring to FIGS. 7A to 7C, a solid state imaging device according to a fourth embodiment will be described. Also in the fourth embodiment, via holes are formed in self alignment with gate electrodes similar to the third embodiment. The via hole forming method is different from that of the third embodiment. The plan views of the solid state imaging device of the fourth embodiment are the same as those of the solid state imaging device of the third embodiment shown in FIGS. 5A to 5D. FIGS. 7A and 7B correspond to a cross sectional view taken along one-dot chain line A11—A11 shown in FIG. 5A, and FIG. 7C corresponds to a cross sectional view taken along one-dot chain line A12—A12 shown in FIG. 5A.

As shown in FIG. 7A, by using processes similar to the processes of forming the structure of the third embodiment shown in FIG. 6A, gate electrodes G, silicon oxide films 34, low impurity concentration regions LDD of source and drain regions, an n-type buried layer 35 and a p$^+$-type layer 36 are formed. Covering the whole substrate surface, a silicon nitride film 80 having a thickness of 50 to 120 nm is formed by CVD.

The silicon nitride film 80 in the peripheral logic circuit area (not shown) is anisotropically etched without etching the silicon nitride film 80 in the pixel, to form sidewall spacers on the sidewalls of gate electrodes. Ion implantation is performed to form the high impurity concentration regions of the source and drain regions of MOS transistors in the peripheral logic circuit area.

As shown in FIG. 7B, on the whole substrate surface, a silicon nitride film 81 having a thickness of 10 to 30 nm is formed by CVD. On this silicon nitride film 81, an interlayer insulating film 82 of silicon oxide having a thickness of 700 to 1500 nm (a general condition of 1000 nm) is formed by CVD. CMP is performed to planarize the surface of the interlayer insulating film 82.

Via holes $H_{FD}$, $H_{VR}$ and $H_{SIG}$ are formed through the interlayer insulating film 82 in such a manner that etching stops at the silicon nitride film 81. The silicon nitride films 81 exposed on the bottoms of the via holes $H_{FD}$, $H_{VR}$ and $H_{SIG}$ and the silicon nitride films 80 are anisotropically etched. The gate oxide films 37 are therefore exposed on the bottoms of the via holes $H_{FD}$, $H_{VR}$ and $H_{SIG}$, and the silicon nitride films 80 are left on the sidewalls of the gate electrodes G. The exposed gate oxide films 37 are removed.

Since the upper surfaces of the gate electrodes G are covered with the silicon oxide films 34, even if there is position misalignment, the gate electrodes will not be exposed in the via holes $H_{FD}$, $H_{VR}$ and $H_{SIG}$. The via holes $H_{FD}$, $H_{VR}$ and $H_{SIG}$ can therefore be formed in self alignment with the gate electrodes.

Conductive plugs 73 made of doped amorphous silicon are buried in the via holes $H_{FD}$, $H_{VR}$ and $H_{SIG}$. The processes to follow are similar to the manufacture processes for the solid state imaging device of the third embodiment.

Figure 7C:
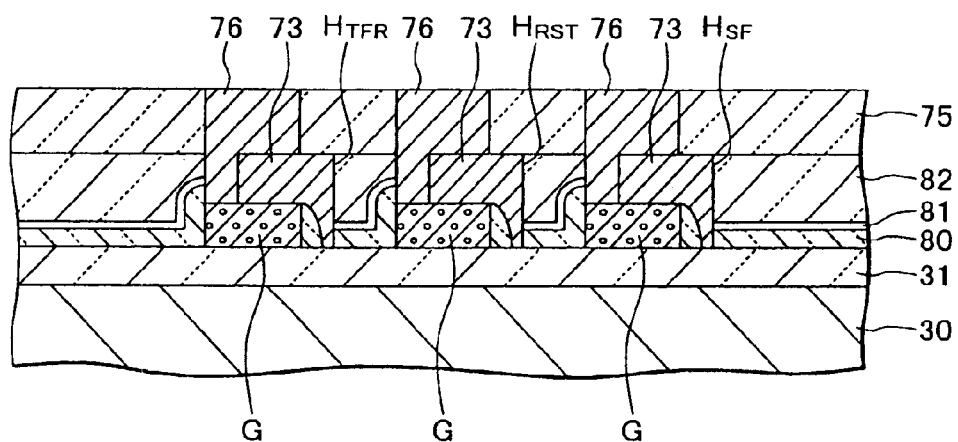

When via holes $H_{TFR}$, $H_{RST}$ and $H_{SF}$ shown in FIG. 7C are formed, the gate oxide film 37 shown in FIG. 7B is removed lastly. In this case, although the surface layer of the element separation insulating film 31 exposed on the bottoms of the via holes $H_{TFR}$, $H_{RST}$ and $H_{SF}$ is etched, this etch amount is small so that no practical problem occurs.

When via holes are formed through the interlayer insulating film 75 on the interlayer insulating film 82, the silicon nitride film 80 is etched lastly. Therefore, even if the position of the via hole is displaced from the gate electrode G, the element separation insulating film 31 of silicon oxide is hardly etched.

Figure 8A:
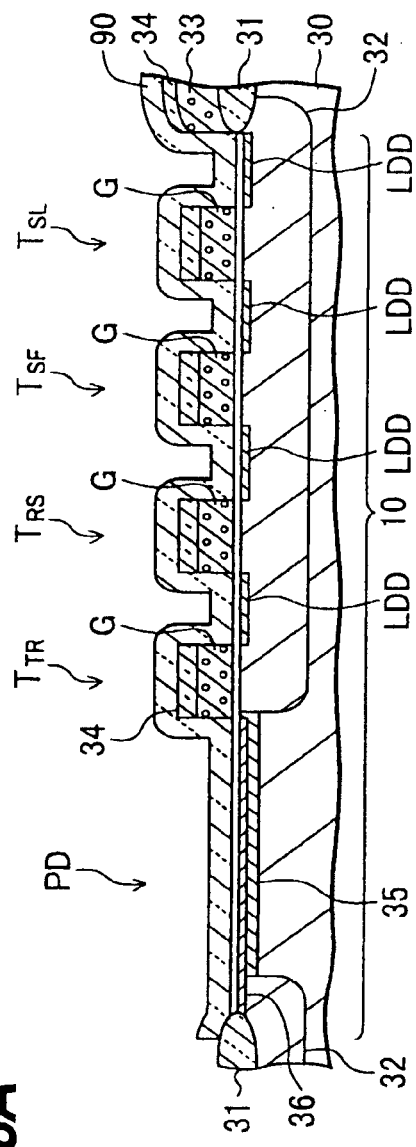
FIGS. 8A to 8C are cross sectional views of a substrate illustrating a method of manufacturing a solid state imaging device according to a fifth embodiment of the third embodiment.
Figure 8B:
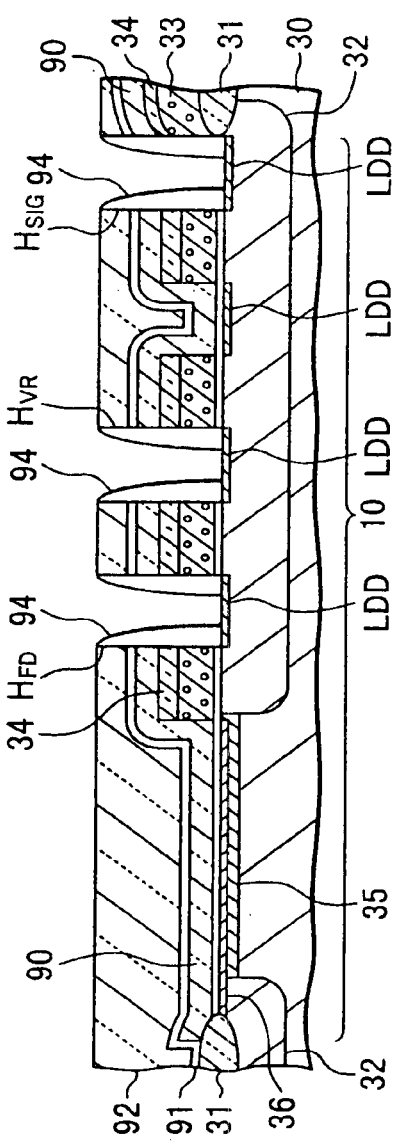

Next, by referring to FIGS. 8A to 8C, a solid state imaging device according to a fifth embodiment will be described. Also in the fifth embodiment, via holes are formed in self alignment with gate electrodes similar to the third embodiment. The via hole forming method is different from that of the third embodiment. The plan views of the solid state imaging device of the fifth embodiment are the same as those of the solid state imaging device of the third embodiment shown in FIGS. 5A to 5D. FIGS. 8A and 8B correspond to a cross sectional view taken along one-dot chain line A11—A11 shown in FIG. 5A, and FIG. 8C corresponds to a cross sectional view taken along one-dot chain line A12—A12 shown in FIG. 5A.

As shown in FIG. 8A, by using processes similar to the processes of forming the structure of the third embodiment shown in FIG. 6A, gate electrodes G, silicon oxide films 34, low impurity concentration regions LDD of source and drain regions, an n-type buried layer 35 and a p$^+$-type layer 36 are formed. Covering the whole substrate surface, a silicon nitride film 90 having a thickness of 50 to 150 nm is formed by CVD.

In the third embodiment, this silicon oxide film is anisotropically etched to form the sidewall spacers SW shown in FIG. 6B. In the fifth embodiment, by covering the pixel area with a resist film, the silicon oxide film 90 is anisotropically etched. Therefore, in the peripheral logic circuit area, sidewall spacers are formed on the sidewalls of gate electrodes, and the silicon oxide film 90 in the pixel is left. At this time, as shown in FIG. 8C, the silicon oxide film 90 on the gate electrode G is not removed.

In the peripheral logic circuit area, the sources and drains of MOS transistors and metal silicide films are formed.

As shown in FIG. 8B, a silicon nitride film 91 having a thickness of 10 to 30 nm is formed by CVD, and on this silicon nitride film 91, an interlayer insulating film 92 of silicon oxide having a thickness of 700 to 1500 nm (a general condition of 1000 nm) is formed by CVD. CMP is performed to planarize the surface of the interlayer insulating film 92.

Via holes $H_{FD}$, $H_{VR}$ and $H_{SIG}$ extending through the interlayer insulating film 92 and reaching the surface of the semiconductor substrate 30 are formed under the condition of a small etching selection ratio between silicon oxide and silicon nitride. A silicon oxide film or a silicon nitride film having a thickness of 30 to 150 nm (a general condition of 100 nm) is deposited on the whole substrate surface, and etched back to form sidewall spacers 94 on the inner walls of the via holes $H_{FD}$, $H_{VR}$ and $H_{SIG}$.

The sidewall spacers 94 electrically insulates conductive plugs to be buried in the via holes $H_{FD}$, $H_{VR}$ and $H_{SIG}$ from the gate electrodes G. Therefore, even if the gate electrodes G are exposed in the via holes $H_{FD}$, $H_{VR}$ and $H_{SIG}$ because of position misalignment immediately after the via holes are formed, the electrical insulation between the gate electrodes G and conductive plugs can be retained ultimately.

Figure 8C:
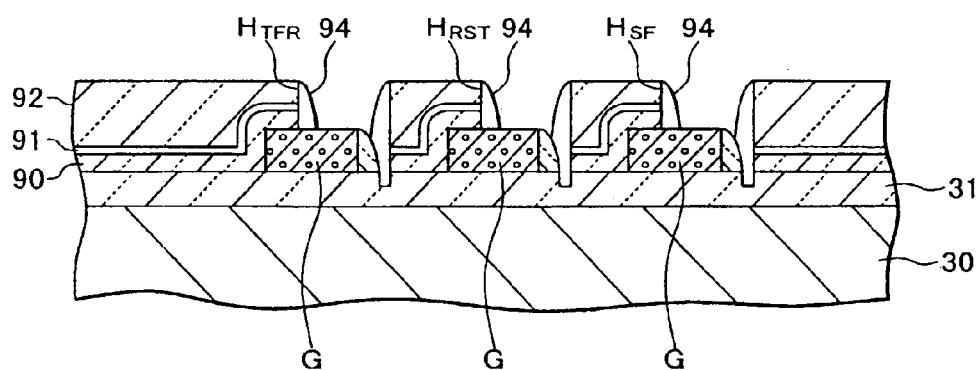

As shown in FIG. 8C, if via holes $H_{TFR}$, $H_{RST}$ and $H_{SF}$ are displaced from the gate electrodes G, the element separation insulating film 31 is partially etched. However, this etched regions are buried with the sidewall spacers 94. Therefore, even if the via holes $H_{TFR}$, $H_{RST}$ and $H_{SF}$ extend through the element separation insulating film 31 and reach the semiconductor substrate 30, the conductive plugs and semiconductor substrate 30 are prevented from electric short-circuit.

Although a position alignment margin between the via holes $H_{FD}$, $H_{VR}$ and $H_{SIG}$ and the gate electrodes is not provided as shown in FIG. 8B, a position alignment margin of about 0.1 μm may be provided.

Next, by referring to FIGS. 9A to FIG. 11, a solid state imaging device according to a sixth embodiment will be described. One pixel of the solid state imaging device of the sixth embodiment is constituted of one photodiode and three transistors.

Figure 9A:
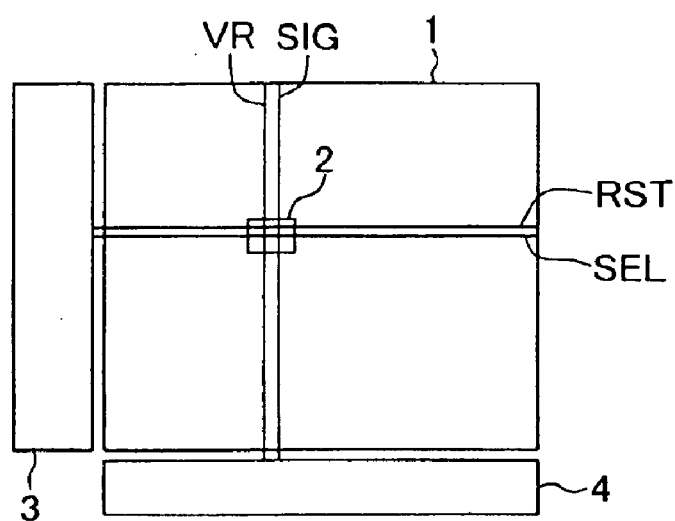
FIG. 9A is a block diagram showing a three-transistor solid state imaging device.

FIG. 9A is a block diagram of a three-transistor solid state imaging device. In the three-transistor imaging device, the transfer signal line TFR of the four-transistor imaging device shown in FIG. 1A is omitted. The other structures are similar to those of the four-transistor solid state imaging device.

Figure 9B:
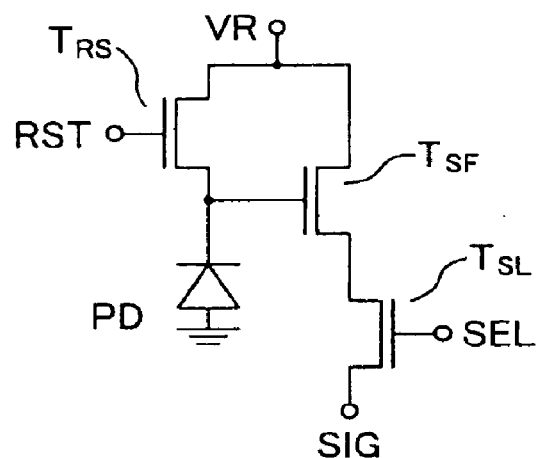
FIG. 9B is an equivalent circuit diagram of the imaging device.

FIG. 9B is an equivalent circuit diagram of one pixel. The transfer transistor $T_{TR}$ of the four-transistor solid state imaging device shown in FIG. 1B is omitted, and the cathode of the photodiode PD is directly connected to the gate electrode of the source follower transistor $T_{SF}$. The other circuit structures are similar to those of the four-transistor solid state imaging device.

Figure 9C:
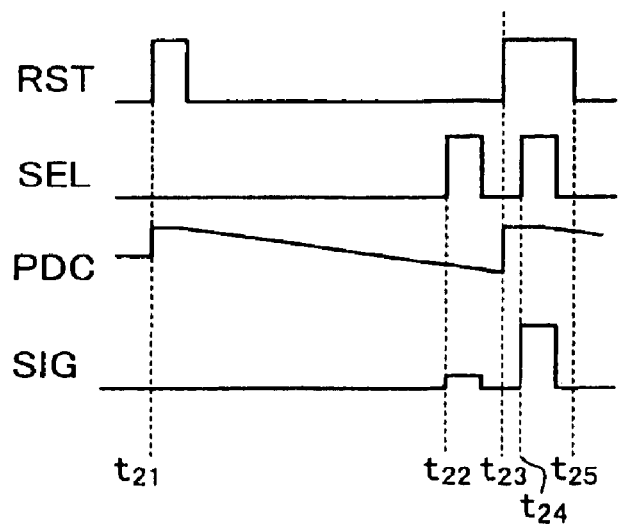
FIG. 9C is a timing chart of the imaging device.

FIG. 9C is the timing chart of various signals of a three-transistor solid state imaging device. At time $t_{21}$ a reset signal RST rises so that a cathode voltage PDC of the photodiode PD is initialized. When the reset signal RST falls, electrons corresponding to a light reception amount are accumulated in the cathode of the photodiode PD and the cathode potential PDC lowers.

At time $t_{22}$ a select signal SEL rises so that an electric signal corresponding to the cathode voltage PDC of the photodiode PD is output to a signal read line SIG. At time $t_{23}$ the reset signal RST rises so that the cathode voltage PDC of the photodiode PD is initialized. At time $t_{24}$ the select signal SEL rises so that an electric signal corresponding to the initialized cathode voltage PDC is output to the signal read line SIG. At time $T_{25}$ the reset signal RST falls so that the cathode voltage PDC of the photodiode PD starts lowering in accordance with the light reception amount.

A difference between the electric signal read at time $t_{22}$ and the electric signal read at time $t_{24}$ is obtained so that an image signal independent from the threshold voltage of a source follower transistor $T_{SF}$ can be obtained.

In the timing chart shown in FIG. 9C, the photodiode PD is initialized at time $t_{21}$ and again initialized at time $t_{23}$. Therefore, after signal charges start being accumulated at time $t_{25}$, the sequence of signal read at time $t_{22}$ may be repeated.

Figure 10:
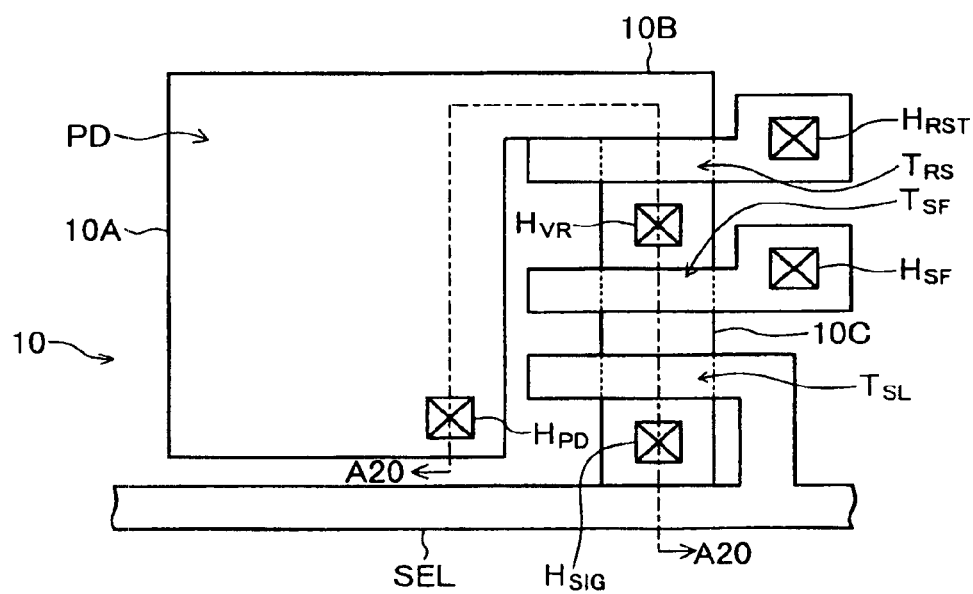
FIG. 10 is a plan view of the pattern of a gate electrode layer of a solid state imaging device according to a sixth embodiment.

FIG. 10 is a plan view of one pixel of the solid state imaging device of the sixth embodiment. This embodiment omits the gate electrode of the transfer transistor $T_{TR}$ and via hole $H_{HF1}$ of the first embodiment shown in FIG. 2A. Instead of the via hole $H_{FD1}$, a via hole $H_{PD}$ for the connection to the cathode region of the photodiode PD is disposed in the photodiode PD near at the lower right corner thereof. Since the gate electrode of the transfer transistor $T_{TR}$ is omitted, a length of one pixel along the column direction becomes short.

Figure 11:
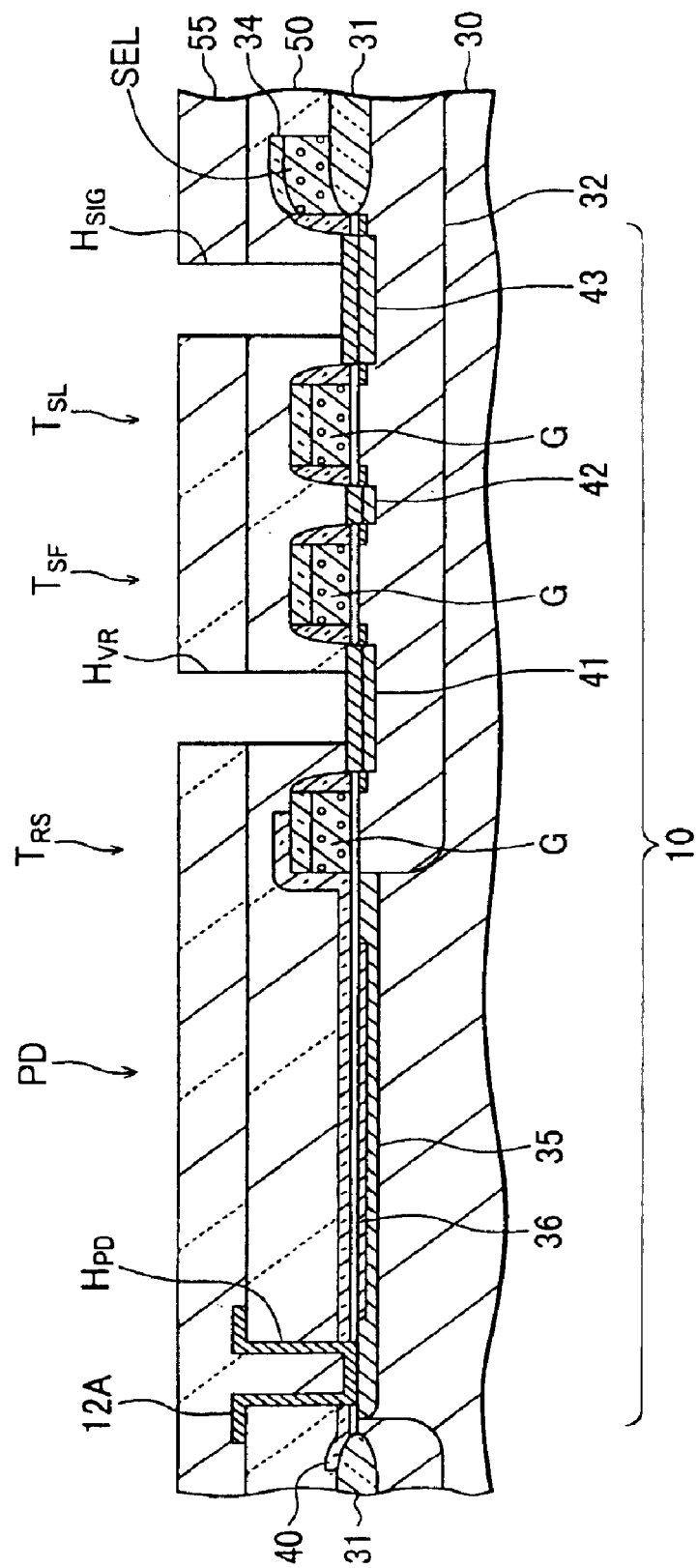
FIG. 11 is a cross sectional view of the solid state imaging device of the sixth embodiment.

FIG. 11 is a cross sectional view taken along one-dot chain line A20—A20 shown in FIG. 10. Description will be given on different points from the cross sectional view of the solid state imaging device of the first embodiment shown in FIG. 3D. Each constituent element shown in FIG. 11 is represented by an identical symbol to that of a corresponding constituent element shown in FIG. 3D. The transfer transistor $T_{TR}$ shown in FIG. 3D is omitted. An n-type buried layer 35 as the cathode of the photodiode PD extends to the border of the gate electrode of the reset transistor $T_{RS}$, and functions also as the source region of the reset transistor $T_{RE}$.

A via hole $H_{PD}$ is formed in a region corresponding to the region where the n-type buried layer 35 is formed and a p$^+$-type layer 36 is not formed. A silicon film 12A is formed on a partial surface area of the interlayer insulating film 50 and on the inner wall of the via hole $H_{PD}$. The silicon film 12A is connected to the n-type buried layer 35 via the via hole $H_{PD}$. Although not shown in FIG. 11, an intra-pixel wiring line similar to the intra-pixel wiring line 15 shown in FIG. 2B and 3E is formed, and the silicon film 12A is connected to the gate electrode of the source follower transistor $T_{SF}$ via the via hole $H_{SF}$ shown in FIG. 10.

In FIG. 11 a buried type photodiode is adopted in which a portion of the n-type buried layer 35 is buried under the p$^+$-type layer 36. An n$^+$-type layer may be formed in the surface layer of the substrate 30 to make the substrate also function as the anode of the photodiode PD.

In the sixth embodiment, the via hole $H_{PD}$ for the connection of the cathode of the photodiode PD to the gate electrode of the source follower $T_{SF}$ is disposed not in the projected area 10B or straight area 10C of the active region 10 but in the rectangular area 10A. If the via hole $H_{PD}$ is disposed in the projected area 10B shown in FIG. 10 similar to the case shown in FIG. 13B, it is necessary to provide a position alignment margin between the via hole $H_{PD}$ and the gate electrode of the reset transistor $T_{RS}$. If the size of the pixel in the column direction is definite, three transistors cannot be disposed in one vertical column and the horizontal area 500D is required to be formed by bending the active region.

The region where the via hole $H_{PD}$ shown in FIG. 10 is disposed cannot be used as the photodiode. However, as apparent from the comparison between FIGS. 10 and 13B, the sixth embodiment shown in FIG. 10 can increase the area of the photodiode PD more than the layout of FIG. 13B.

The via holes of the three-transistor solid state imaging device of the sixth embodiment may be formed in self alignment with the gate electrodes, similar to the third to fifth embodiments.

Figure 12:
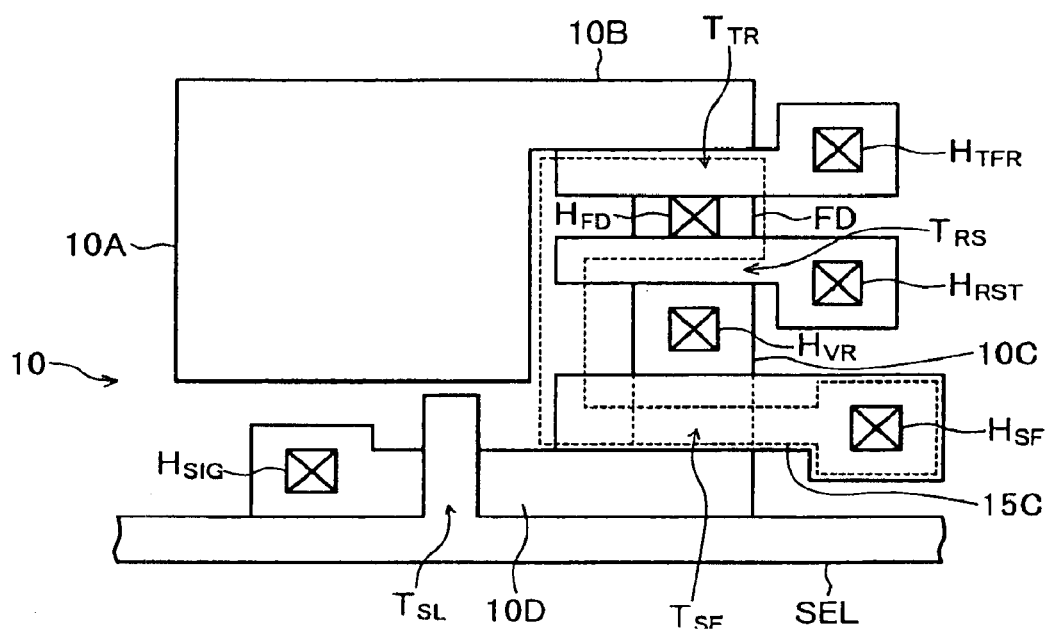
FIG. 12 is a plan view of the pattern of a gate electrode layer of a solid state imaging device according to a seventh embodiment.

Next, by referring to FIG. 12, a solid state imaging device according to a seventh embodiment will be described. Description will be given on different points from the solid state imaging device of the first embodiment shown in FIG. 2A.

In the solid state imaging device of the seventh embodiment, the length in the column direction of the rectangular area 10A of the active region 10 is short and the straight area 10C is bent at 90° toward the photodiode side. The gate electrode of the select transistor $T_{SL}$ is bent and crosses an area 10D extending in the row direction.

The gate electrodes of the other transfer transistor $T_{TR}$, reset transistor $T_{RS}$ and source follower transistor $T_{SF}$ cross the straight area 10C extending in the column direction, similar to the first embodiment shown in FIG. 2A.

The distance between the gate electrodes of the transfer transistor $T_{TR}$ and reset transistor $T_{RS}$ is shorter than that of the first embodiment shown in FIG. 2A. Therefore, the via hole $H_{FD}$ to be disposed in the region corresponding to the floating diffusion region FD is formed in self alignment with the gate electrode, similar to the third embodiment shown in FIG. 5A. It is therefore possible to reduce the area of the floating diffusion region FD. As the area of the floating diffusion region FD becomes small, a sensitivity of converting signal charges into a voltage signal can be raised.

One end of an intra-pixel wiring line 15C is connected to the floating diffusion region FD via the via hole $H_{FD}$, and the other end is connected to the gate electrode of the source follower transistor $T_{SF}$. The intra-pixel wiring line 15C is made of a two-layer structure of a silicon layer and a metal silicide layer, similar to the intra-pixel wiring line 15A shown in FIG. 4B.

As viewed along a line parallel to the normal to the substrate surface, the intra-pixel wiring line 15C is disposed inclusive of the floating diffusion region FD. Since the floating diffusion region FD is covered with the intra-pixel wiring line 15C, the light shielding function for the floating diffusion region FD can be enhanced. Since it is not necessary to form the intra-pixel wiring line 15C by using an upper metal wiring layer, the wiring layout in the metal wiring layer can be designed with ease.

The present invention has been described in connection with the preferred embodiments. The invention is not limited only to the above embodiments. It is apparent that various modifications, improvements, combinations, and the like can be made by those skilled in the art.

I claim:

1. A semiconductor device comprising:
    a plurality of pixels disposed over a semiconductor substrate in a matrix shape;
    wherein:
    each of the pixels comprises a photodiode, a reset transistor, a source follower transistor and a select transistor;
    the photodiode comprises an impurity diffusion region of a first conductivity type and an impurity diffusion region of a second conductivity type stacked in a thickness direction;
    each of the reset transistor, the source follower transistor and the select transistor comprises a pair of impurity diffusion regions of the first conductivity type formed in a surface layer of the semiconductor substrate and having a channel region between the impurity diffusion regions and a gate electrode formed over the channel region;
    the photodiode, the reset transistor, the source follower transistor and the select transistor are disposed in one active region;
    the active region comprises a first area in which the photodiode is disposed and a second area having a first end continuous with the first area and including an area elongated along a first direction; and
    each of gate electrodes of the reset transistor, the source follower transistor and the select transistor crosses the area, elongated along the first direction, of the second area, and a cross area between the gate electrode of the reset transistor and the area, a cross area between the gate electrode of the source follower transistor and the area and a cross area between the gate electrode of the select transistor and the area, are disposed in this order in a direction of departing from the first end,
    an intra-pixel wiring line for interconnecting the impurity diffusion region of the reset transistor on the first end side and the gate electrode of the source follower transistor of the pixel;
    a reset voltage supply line connected to the impurity diffusion region between the gate electrodes of the reset transistor and the source follower transistor and being applied with a reset voltage for applying an initial reverse bias to the photodiode;
    a reset signal line for applying a reset signal to the gate electrode of the reset transistor;
    a select signal line disposed for each row of the pixels, the select signal line applying a select signal to the gate electrodes of the select transistors of the pixels in a corresponding row; and
    a signal read line disposed for each column of the pixels and connected to the impurity diffusion regions, on a side opposite to the first end, of the select transistors of the pixels in a corresponding column.

2. A semiconductor device according to claim 1, wherein:
    each of the pixels further comprises a transfer transistor disposed in the second area and having a pair of impurity diffusion regions having a channel region formed between the impurity diffusion regions and a gate electrode formed over the channel region;
    the gate electrode of the transfer transistor crosses the area, elongated in the first direction, of the second area in an area nearer to the first end than the cross area between the gate electrode of the reset transistor and the second area, and the impurity diffusion region of the transfer transistor on the first end side is connected to the impurity diffusion region of the first conductivity type of the photodiode; and
    the semiconductor device further comprises a transfer signal line for applying a transfer signal to the gate electrode of the transfer transistor.

3. A semiconductor device according to claim 2, wherein the transfer signal line is disposed in a same conductive layer as the gate electrode of the transfer transistor.

4. A semiconductor device according to claim 1, wherein the reset signal line is disposed in a same conductive layer as the gate electrode of the reset transistor.

5. A semiconductor device according to claim 1, wherein the select signal line is disposed in a same conductive layer as the gate electrode of the select transistor.

6. A semiconductor device according to claim 1, wherein at least a partial region of the intra-pixel wiring line connecting the impurity diffusion region of the reset transistor on the first end side is made of silicon.

7. A semiconductor device according to claim 1, further comprising:
    upper gate protective films covering an upper surface of the gate electrodes of the reset transistor, the source follower transistor and the select transistor;

side gate protective films covering sidewalls of the gate electrodes of the reset transistor, the source follower transistor and the select transistor;

an interlayer insulating film formed over the semiconductor substrate and covering the reset transistor, the source follower transistor and the select transistor;

a first via hole formed through the interlayer insulating film, an upper surface of the impurity diffusion region of the reset transistor on the first end side appearing on a bottom of the first via hole;

a second via hole formed through the interlayer insulating film, an upper surface of the impurity diffusion region between the gate electrodes of the reset transistor and the source follower transistor appearing on a bottom of the second via hole; and a third via hole formed through the interlayer insulating film, an upper surface of the impurity diffusion region of the select transistor on a side opposite to the first end side appearing on a bottom of the third via hole, wherein:

the intra-pixel wiring line is connected to the impurity diffusion region of the reset transistor on the first end side via the first via hole;

the reset voltage supply line is connected to the impurity diffusion region between the gate electrodes of the reset transistor and the source follower transistor via the second via hole; and the signal read line is connected to the impurity diffusion region of the select transistor on a side opposite to the first end via the third via hole, and wherein:

the side gate protective film covering the sidewall of the gate electrode of the reset transistor appearing on a side of the first via hole;

the side gate protective film covering the sidewall of the gate electrode of the reset transistor and the side gate protective film covering the sidewall of the source follower transistor appearing on a side of the second via hole; or the side gate protective film covering the sidewall of the select transistor appearing on a side of the third via hole.

8. A semiconductor device according to claim 7, wherein the interlayer insulating film comprises a layer covering an area of the upper gate protective films and the side gate protective films not appearing on the sides of the first to third via holes, the layer being made of material having etching characteristics different from the upper gate protective films and the side gate protective films.

9. A semiconductor device according to claim 7, wherein:

each of the pixels further comprises a transfer transistor disposed in the second area and having a pair of impurity diffusion regions having a channel region formed between the impurity diffusion regions and a gate electrode formed over the channel region;

the gate electrode of the transfer transistor crosses the area, elongated in the first direction, of the second area in an area nearer to the first end than the cross area between the gate electrode of the reset transistor and the second area, and the impurity diffusion region of the transfer transistor on the first end side is connected to the impurity diffusion region of the first conductivity type of the photodiode; and the semiconductor device further comprises:

a transfer signal line for applying a transfer signal to the gate electrode of the transfer transistor;

an upper gate protective film covering an upper surface of the gate electrode of the transfer transistor; and a side gate protective film covering sidewalls of the gate electrode of the transfer transistor, wherein the side gate protective film covering the sidewalls of the gate electrode of the transfer transistor appearing on a side of the first via hole.

10. A semiconductor device according to claim 1, further comprising:

an interlayer insulating film formed over the semiconductor substrate and covering the reset transistor, the source follower transistor and the select transistor;

a first via hole formed through the interlayer insulating film, an upper surface of the impurity diffusion region of the reset transistor on the first end side appearing on a bottom of the first via hole;

a second via hole formed through the interlayer insulating film, an upper surface of the impurity diffusion region between the gate electrodes of the reset transistor and the source follower transistor appearing on a bottom of the second via hole;

a third via hole formed through the interlayer insulating film, an upper surface of the impurity diffusion region of the select transistor on a side opposite to the first end side appearing on a bottom of the third via hole; and a sidewall spacer made of insulating material and covering a side of each of the first to third via holes, wherein:

the intra-pixel wiring line is connected to the impurity diffusion region of the reset transistor on the first end side via the first via hole;

the reset voltage supply line is connected to the impurity diffusion region between the gate electrodes of the reset transistor and the source follower transistor via the second via hole; and the signal read line is connected to the impurity diffusion region of the select transistor on a side opposite to the first end side via the third via hole.

11. A semiconductor device according to claim 10, wherein a sidewall of the gate electrode of the reset transistor appears on a side of the first via hole, sidewalls of the gate electrodes of the reset transistor and the source follower transistor appear on a sidewall of the second via hole, and a sidewall of the gate electrode of the select transistor appears on a sidewall of the third via hole.

12. A semiconductor device according to claim 10, wherein:

each of the pixels further comprises a transfer transistor disposed in the second area and having a pair of impurity diffusion regions having a channel region formed between the impurity diffusion regions and a gate electrode formed over the channel region; and a transfer signal line for applying a transfer signal to the gate electrode of the transfer transistor, wherein:

the gate electrode of the transfer transistor crosses the area, elongated in the first direction, of the second area in an area nearer to the first end than the cross area between the gate electrode of the reset transistor and the second area, and the impurity diffusion region of the transfer transistor on the first end side is connected to the impurity diffusion region of the first conductivity type of the photodiode; and a sidewall of the gate electrode of the transfer transistor appears on a sidewall of the first via hole.

13. A semiconductor device according to claim 1, wherein the intra-pixel wiring line from a region connected to the impurity diffusion region of the reset transistor on the first end side to a region connected to the gate electrode of the source follower transistor comprises a silicon layer or a lamination layer including a silicon layer as a lowest layer.

14. A semiconductor device according to claim 13, wherein one of the reset signal line and the select signal line is disposed in a same conductive layer as the intra-pixel wiring line.

15. A semiconductor device according to claim 2, wherein the intra-pixel wiring line from a region connected to the impurity diffusion region of the reset transistor on the first end side to a region connected to the gate electrode of the source follower transistor comprises a silicon layer or a lamination layer including a silicon layer as a lowest layer.

16. A semiconductor device according to claim 15, wherein one of the reset signal line, the select signal line and the transfer signal line is disposed in a same conductive layer as the intra-pixel wiring line.

17. A semiconductor device according to claim 1, wherein the first area comprises a straight outer periphery and the area, elongated along the first direction, of the second area runs in parallel to the straight outer periphery of the first area.

18. A semiconductor device comprising:
a plurality of pixels disposed over a semiconductor substrate in a matrix shape;
wherein:
each of the pixels comprises a photodiode, a reset transistor; a source follower transistor and a select transistor;
the photodiode comprises an impurity diffusion region of a first conductivity type and an impurity diffusion region of a second conductivity type stacked in a thickness direction;
each of the reset transistor, the source follower transistor and the select transistor comprises a pair of impurity diffusion regions of a first conductivity type formed in a surface layer of the semiconductor substrate and having a channel region between the impurity diffusion regions and a gate electrode formed over the channel region;
the photodiode, the reset transistor, the source follower transistor and the select transistor are disposed in one active region;
the active region comprises a first area in which the photodiode is disposed and a second area having a first end continuous with the first area and an elongated shape; and
each of gate electrodes of the reset transistor, the source follower transistor and the select transistor crosses the second area, and a cross area between the gate electrode of the reset transistor and the elongated shape, a cross area between the gate electrode of the source follower transistor and the elongated shape and a cross area between the gate electrode of the select transistor and the elongated shape, are disposed in this order in a direction of departing from the first end,
an intra-pixel wiring line for interconnecting the impurity diffusion region of the reset transistor on the first end side and the gate electrode of the source follower transistor of the pixel, at least a region of the intra-pixel wiring line connected to the impurity diffusion region of the reset transistor on the first end side being made of silicon;
a reset voltage supply line connected to the impurity diffusion region between the gate electrodes of the reset transistor and the source follower transistor and being applied with a reset voltage for applying an initial reverse bias to the photodiode;
a reset signal line for applying a reset signal to the gate electrode of the reset transistor;
a select signal line disposed for each row of the pixels, the select signal line applying a select signal to the gate electrodes of the select transistors of the pixels in a corresponding row; and
a signal read line disposed for each column of the pixels and connected to the impurity diffusion regions, on a side opposite to the first end, of the select transistors of the pixels in a corresponding column.

19. A semiconductor device according to claim 18, wherein:
each of the pixels further comprises a transfer transistor disposed in the second area and having a pair of impurity diffusion regions having a channel region formed between the impurity diffusion regions and a gate electrode formed over the channel region;
the gate electrode of the transfer transistor crosses the second area between the gate electrode of the reset transistor and the first end of the second area, and the impurity diffusion region of the transfer transistor on the first end side is connected to the impurity diffusion region of the first conductivity type of the photodiode; and
the semiconductor device further comprises a transfer signal line for applying a transfer signal to the gate electrode of the transfer transistor.

20. A semiconductor device according to claim 18, wherein the intra-pixel wiring line from a region connected to the impurity diffusion region of the reset transistor on the first end side to a region connected to the gate electrode of the source follower transistor of the pixel comprises a silicon layer or a lamination layer including a silicon layer as a lowest layer.

21. A semiconductor device according to claim 20, wherein one of the reset signal line and the select signal line is disposed in a same conductive layer as the intra-pixel wiring line.

22. A semiconductor device comprising:
a plurality of pixels disposed over a semiconductor substrate in a matrix shape;
wherein:
each of the pixels comprises a photodiode, a reset transistor; a source follower transistor and a select transistor;
the photodiode comprises an impurity diffusion region of a first conductivity type and an impurity diffusion region of a second conductivity type stacked in a thickness direction;
each of the reset transistor, the source follower transistor and the select transistor comprises a pair of impurity diffusion regions of the first conductivity type formed in a surface layer of the semiconductor substrate and having a channel region between the impurity diffusion regions and a gate electrode formed over the channel region;
the photodiode, the reset transistor, the source follower transistor and the select transistor are disposed in one active region;
the active region comprises a first area in which the photodiode is disposed and a second area having a first end continuous with the first area and an elongated shape; and each of gate electrodes of the reset transistor, the source follower transistor and the select transistor crosses the second area, and a cross area between the gate electrode of the reset transistor and the second area, a cross area between the gate electrode of the source follower transistor and the second area and a cross area between the gate electrode of the select transistor and the second area, are disposed in this order in a direction of departing from the first end, an intra-pixel wiring line for interconnecting the impurity diffusion region of the reset transistor on the first end side and the gate electrode of the source follower transistor of the pixel;

a reset voltage supply line connected to the impurity diffusion region between the gate electrodes of the reset transistor and the source follower transistor and being applied with a reset voltage for applying an initial reverse bias to the photodiode;

a reset signal line for applying a reset signal to the gate electrode of the reset transistor;

a select signal line disposed for each row of the pixels, the select signal line applying a select signal to the gate electrodes of the select transistors of the pixels in a corresponding row;

a signal read line disposed for each column of the pixels and connected to the impurity diffusion regions, on a side opposite to the first end, of the select transistors of the pixels in a corresponding column;

an upper gate protective film covering an upper surface of the gate electrodes of the reset transistor, the source follower transistor and the select transistor;

a side gate protective film covering sidewalls of the gate electrodes of the reset transistor, the source follower transistor and the select transistor;

an interlayer insulating film formed over the semiconductor substrate and covering the reset transistor, the source follower transistor and the select transistor;

a first via hole formed through the interlayer insulating film, an upper surface of the impurity diffusion region of the reset transistor on the first end side appearing on a bottom of the first via hole, and the side gate protective film covering the sidewall of the gate electrode of the reset transistor appearing on a sidewall of the first via hole;

a second via hole formed through the interlayer insulating film, an upper surface of the impurity diffusion region between the gate electrodes of the reset transistor and the source follower transistor appearing on a bottom of the second via hole, and the side gate protective film covering the sidewall of the gate electrode of the reset transistor and the side gate protective film covering the sidewall of the source follower transistor appearing on a sidewall of the second via hole; and a third via hole formed through the interlayer insulating film, an upper surface of the impurity diffusion region of the select transistor on a side opposite to the first end side appearing on a bottom of the third via hole, and the side gate protective film covering the sidewall of the gate electrode of the select transistor appearing on a sidewall of the third via hole, wherein:

the intra-pixel wiring line is connected to the impurity diffusion region of the reset transistor on the first end side via the first via hole;

the reset voltage supply line is connected to the impurity diffusion region between the gate electrodes of the reset transistor and the source follower transistor via the second via hole; and the signal read line is connected to the impurity diffusion region of the select transistor on a side opposite to the first end side via the third via hole.

23. A semiconductor device according to claim 22, wherein the interlayer insulating film comprises a layer covering an area of the upper gate protective films and the side gate protective films not appearing on the sidewalls of the first to third via holes, the layer being made of material having etching characteristics different from the upper gate protective films and the side gate protective films.

24. A semiconductor device comprising:

a plurality of pixels disposed over a semiconductor substrate in a matrix shape;

wherein:

each of the pixels comprises a photodiode, a reset transistor; a source follower transistor and a select transistor;

the photodiode comprises an impurity diffusion region of a first conductivity type and an impurity diffusion region of a second conductivity type stacked in a thickness direction;

each of the reset transistor, the source follower transistor and the select transistor comprises a pair of impurity diffusion regions of the first conductivity type formed in a surface layer of the semiconductor substrate and having a channel region between the impurity diffusion regions and a gate electrode formed over the channel region;

the photodiode, the reset transistor, the source follower transistor and the select transistor are disposed in one active region;

the active region comprises a first area in which the photodiode is disposed and a second area having a first end continuous with the first area and an elongated shape; and each of gate electrodes of the reset transistor, the source follower transistor and the select transistor crosses the second area, and a cross area between the gate electrode of the reset transistor and the second area, a cross area between the gate electrode of the source follower transistor and the second area and a cross area between the gate electrode of the select transistor and the second area, are disposed in this order along a direction of departing from the first end, an intra-pixel wiring line for interconnecting the impurity diffusion region of the reset transistor on the first end side and the gate electrode of the source follower transistor of the pixel;

a reset voltage supply line connected to the impurity diffusion region between the gate electrodes of the reset transistor and the source follower transistor and being applied with a reset voltage for applying an initial reverse bias to the photodiode;

a reset signal line for applying a reset signal to the gate electrode of the reset transistor;

a select signal line disposed for each row of the pixels, the select signal line applying a select signal to the gate electrodes of the select transistors of the pixels in a corresponding row;

a signal read line disposed for each column of the pixels and connected to the impurity diffusion regions, on a side opposite to the first end, of the select transistors of the pixels in a corresponding column;

an interlayer insulating film formed over the semiconductor substrate and covering the reset transistor, the source follower transistor and the select transistor;

a first via hole formed through the interlayer insulating film, an upper surface of the impurity diffusion region of the reset transistor on the first end side appearing on a bottom of the first via hole;

a second via hole formed through the interlayer insulating film, an upper surface of the impurity diffusion region between the gate electrodes of the reset transistor and the source follower transistor appearing on a bottom of the second via hole;

a third via hole formed through the interlayer insulating film, an upper surface of the impurity diffusion region of the select transistor on a side opposite to the first end side appearing on a bottom of the third via hole; and a sidewall spacer made of insulating material and covering a sidewall of each of the first to third via holes, wherein:

the intra-pixel wiring line is connected to the impurity diffusion region of the reset transistor on the first end side via the first via hole;

the reset voltage supply line is connected to the impurity diffusion region between the gate electrodes of the reset transistor and the source follower transistor via the second via hole; and the signal read line is connected to the impurity diffusion region of the select transistor on a side opposite to the first end via the third via hole.

25. A semiconductor device according to claim 24, wherein a sidewall of the gate electrode of the reset transistor appears on a sidewall of the first via hole, sidewalls of the gate electrodes of the reset transistor and the source follower transistor appear on a sidewall of the second via hole, and a sidewall of the gate electrode of the select transistor appears on a sidewall of the third via hole.

26. A semiconductor device comprising:

a plurality of pixels disposed over a semiconductor substrate in a matrix shape;

wherein:

each of the pixels comprises a photodiode, a reset transistor, a source follower transistor and a select transistor;

the photodiode comprises an impurity diffusion region of a first conductivity type and an impurity diffusion region of a second conductivity type stacked in a thickness direction;

each of the reset transistor, the source follower transistor and the select transistor comprises a pair of impurity diffusion regions of the first conductivity type formed in a surface layer of the semiconductor substrate and having a channel region between the impurity diffusion regions and a gate electrode formed over the channel region;

the photodiode, the reset transistor, the source follower transistor and the select transistor are disposed in one active region;

the active region comprises a first area in which the photodiode is disposed and a second area having a first end continuous with the first area and including an area elongated along a first direction; and each of gate electrodes of the reset transistor, the source follower transistor and the select transistor crosses the area, elongated along the first direction, of the second area, and a cross area between the gate electrode of the reset transistor and the second region, a cross area between the gate electrode of the source follower transistor and the second region and a cross area between the gate electrode of the select transistor and the second region, are disposed in this order in a direction of departing from the first end, an intra-pixel wiring line for interconnecting the impurity diffusion region of the reset transistor on the first end side and the gate electrode of the source follower transistor of the pixel;

a reset voltage supply line connected to the impurity diffusion region between the gate electrodes of the reset transistor and the source follower transistor and being applied with a reset voltage for applying an initial reverse bias to the photodiode;

a reset signal line for applying a reset signal to the gate electrode of the reset transistor;

a select signal line disposed for each row of the pixels, the select signal line applying a select signal to the gate electrodes of the select transistors of the pixels in a corresponding row;

a signal read line disposed for each column of the pixels and connected to the impurity diffusion regions, on a side opposite to the first end, of the select transistors of the pixels in a corresponding column;

upper gate protective films covering an upper surface of the gate electrodes of the reset transistor, the source follower transistor and the select transistor;

side gate protective films covering sidewalls of the gate electrodes of the reset transistor, the source follower transistor and the select transistor;

an interlayer insulating film formed over the semiconductor substrate and covering the reset transistor, the source follower transistor and the select transistor;

a first via hole formed through the interlayer insulating film, an upper surface of the impurity diffusion region of the reset transistor on the first end side appearing on a bottom of the first via hole;

a second via hole formed through the interlayer insulating film, an upper surface of the impurity diffusion region between the gate electrodes of the reset transistor and the source follower transistor appearing on a bottom of the second via hole; and a third via hole formed through the interlayer insulating film, an upper surface of the impurity diffusion region of the select transistor on a side opposite to the first end side appearing on a bottom of the third via hole, wherein each of the first via hole, the second via hole and the third via hole has self-aligned contact structure.

* * * * *